(12) United States Patent
Hurwitz

(10) Patent No.: US 10,153,750 B2
(45) Date of Patent: Dec. 11, 2018

(54) RF RESONATORS AND FILTERS

(71) Applicant: ZHUHAI CRYSTAL RESONANCE TECHNOLOGIES CO., LTD., Zhuhai OT (CN)

(72) Inventor: Dror Hurwitz, Zhuhai (CN)

(73) Assignee: ZHUHAI CRYSTAL RESONANCE TECHNOLOGIES CO., LTD., Zhuhai OT (CN)

( * ) Notice: Subject to any disclaimer, the term of this patent is extended or adjusted under 35 U.S.C. 154(b) by 0 days.

(21) Appl. No.: 15/494,825

(22) Filed: Apr. 24, 2017

(65) Prior Publication Data

US 2018/0278236 A1  Sep. 27, 2018

Related U.S. Application Data

(63) Continuation-in-part of application No. 15/468,710, filed on Mar. 24, 2017.

(51) Int. Cl.

| | |
|---|---|
| *H03H 9/205* | (2006.01) |
| *H03H 9/58* | (2006.01) |
| *H03H 9/56* | (2006.01) |
| *H01L 41/18* | (2006.01) |
| *H01L 41/08* | (2006.01) |
| *H01L 29/04* | (2006.01) |
| *H01L 23/00* | (2006.01) |

(52) U.S. Cl.
CPC ............ *H03H 9/205* (2013.01); *H01L 24/06* (2013.01); *H01L 24/14* (2013.01); *H01L 29/045* (2013.01); *H01L 41/0815* (2013.01); *H01L 41/183* (2013.01); *H03H 9/568* (2013.01); *H01L 2224/0401* (2013.01)

(58) Field of Classification Search
CPC .. H03H 9/173; H03H 9/105; H03H 2003/021; H03H 9/0571; H03H 9/587; H03H 9/1007; H03H 9/1042; H03H 9/205
USPC .................................................. 333/186–192
See application file for complete search history.

(56) References Cited

U.S. PATENT DOCUMENTS

| | | | |
|---|---|---|---|
| 7,053,730 B2 * | 5/2006 | Park .......................... | H03H 3/02 29/25.35 |
| 7,443,270 B2 * | 10/2008 | Motai ....................... | H03H 3/02 310/312 |

(Continued)

*Primary Examiner* — Dean Takaoka
*Assistant Examiner* — Alan Wong
(74) *Attorney, Agent, or Firm* — Wiggin and Dana LLP; Gregory S. Rosenblatt; Andrew D. Bochner

(57) ABSTRACT

A filter package comprising an array of piezoelectric films sandwiched between lower electrodes and an array of upper electrodes covered by an array of silicon membranes with cavities thereover: the lower electrode being coupled to an interposer with a first cavity between the lower electrodes and the interposer; the array of silicon membranes having a known thickness and attached over the upper electrodes with an array of upper cavities, each upper cavity between a silicon membrane of the array and a common silicon cover; each upper cavity aligned with a piezoelectric film, an upper electrode and silicon membrane, the upper cavities having side walls comprising $SiO_2$; the individual piezoelectric films, their upper electrodes and silicon membranes thereover being separated from adjacent piezoelectric films, upper electrodes and silicon membranes by a passivation material.

31 Claims, 21 Drawing Sheets

(56) References Cited

U.S. PATENT DOCUMENTS

| | | | |
|---|---|---|---|
| 7,511,595 B2* | 3/2009 | Park | H03H 3/04 |
| | | | 29/25.35 |
| 8,910,355 B2* | 12/2014 | Adkisson | H03H 9/173 |
| | | | 29/25.35 |
| 9,054,671 B2* | 6/2015 | Adkisson | H03H 9/173 |
| 9,735,338 B2* | 8/2017 | Guillou | H01L 41/0533 |
| 9,917,567 B2* | 3/2018 | Bradley | H03H 3/02 |

* cited by examiner

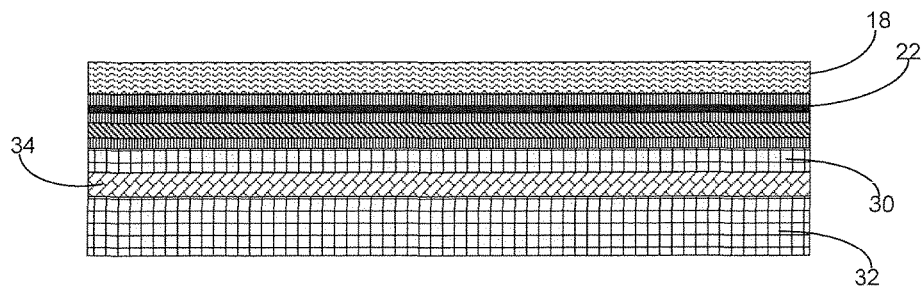
Fig. 26
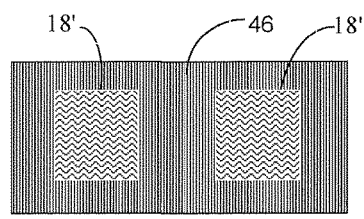
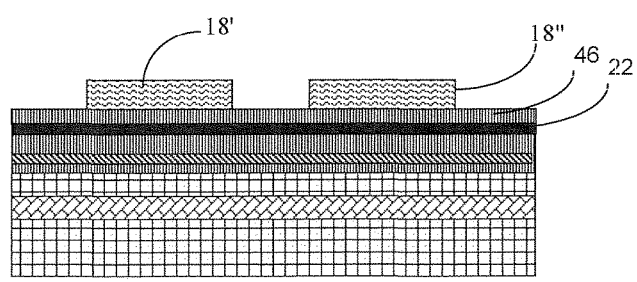
Fig. 27　　　　Fig. 28
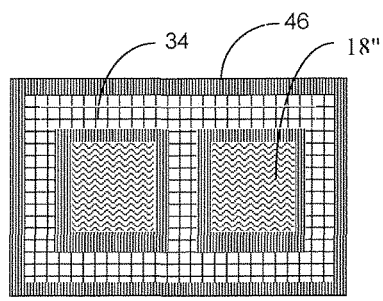
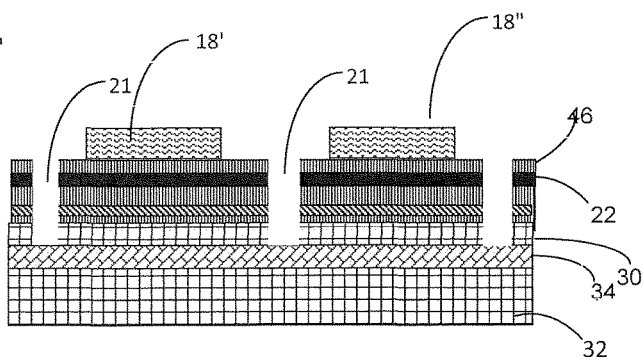
Fig. 29　　　　Fig. 30

RF RESONATORS AND FILTERS

BACKGROUND

Mobile phone users require quality reception and transmission over a wide area. The quality of the radio frequency (RF) signal depends on the RF filters in the mobile phone. Each RF filter passes desired frequencies and rejects unwanted frequencies enabling band selection and allowing a mobile phone to process only the intended signal.

It has been estimated that by 2020, a shift to Carrier aggregation, 5G and 4×4 MIMO could result in mobile phones requiring upwards of 100 filters and a global market of 200 billion filters a year.

Acoustic resonators are a basic building block of RF filters and sensors. These typically include a piezoelectric electromechanical transduction layer which converts mechanical energy into electrical energy. These resonators have to be cheap but reliable. The two most common types of acoustic resonators are Surface Acoustic Wave Resonators (SAW) and Bulk Acoustic Wave Resonators (BAW).

In Surface Acoustic Wave resonators the acoustic signal is carried by a surface wave. In Bulk Acoustic Wave Resonators (BAW) the signal is carried through the bulk of the resonator film. The resonant frequency of both types of filter is a characteristic of its dimensions and of the mechanical properties of the materials used in their construction.

The quality of a resonator is given by its Q factor. This is the ratio of the energy stored to the power dissipated. A high Q factor indicates that the filter loses little energy during operation. This translates to a lower insertion loss and a steeper skirt for "sharper" differentiation to nearby bands.

The next generation of mobile phones will be required to operate at higher frequencies to enable transmitting and receiving the ever growing data traffic. Moving to such higher frequencies without enlarging the mobile phone requires small low power resonators that operate at higher frequencies and that can be used in smart phones without rapid depletion of the battery power pack.

The quality factor or Q factor is a dimensionless parameter that describes how under-damped an oscillator or resonator is, and characterizes a resonator's bandwidth relative to its center frequency. The next generation of mobile phones requires quality resonators having high Q factors.

Bulk-acoustic-wave (BAW) filters provide better performance than surface acoustic wave filters. Whereas the best SAW filters may have Q factors of 1000 to 1500, current state of the art BAW resonators have Q factors of 2500 to 5000.

BAW filters can operate at higher frequencies than SAW filters. They have better power handling, a smaller size, higher electrostatic discharge (ESD), better bulk radiation and less out of band ripple.

However, SAW filters are simpler and cheaper to manufacture and since the IDT pitch can be varied by the mask layout, resonators having significantly different frequencies can be made on the same die, using the same piezoelectric film thickness.

The electrical impedance of a BAW resonator has two characteristic frequencies: the resonance frequency $f_R$ and anti-resonance frequency $f_A$. At $f_R$, the electrical impedance is very small whereas at $f_A$, the electrical impedance is very large. Filters are made by combining several resonators. The shunt resonator is shifted in frequency with respect to the series resonator. When the resonance frequency of the series resonator equals the anti-resonance frequency of the shunt resonator, the maximum signal is transmitted from the input to the output of the device. At the anti-resonance frequency of the series resonator, the impedance between the input and output terminals is high and the filter transmission is blocked. At the resonance frequency of the shunt resonator, any current flowing into the filter section is shorted to ground by the low impedance of the shunt resonator so that the BAW filter also blocks signal transmission at this frequency. The frequency spacing between $f_R$ and $f_A$ determines the filter bandwidth.

For frequencies other than the resonance and anti-resonance frequencies, the BAW resonator behaves like a Metal-Insulator-Metal (MIM) capacitor. Consequently, far below and far above these resonances, the magnitude of the electrical impedance is proportional to 1/f where f is the frequency. The frequency separation between $f_R$ and $f_A$ is a measure of the strength of the piezoelectric effect in the resonator that is known as the effective coupling coefficient—represented by $K^2_{eff}$. Another way to describe the effective coupling coefficient is as a measure of the efficiency of the conversion between electrical and mechanical energy by the resonator (or filter). It will be noted that the electromechanical coupling coefficient is a materials related property that defines the $K^2_{eff}$ for the piezoelectric film.

The level of performance of a filter is given by its factor of merit (FOM) which is defined as FOM=$Q*K^2_{eff}$.

For practical applications, both a sufficiently high $K^2_{eff}$ and high Q factor values are desired. However, there is a trade-off between these parameters. Although $K^2_{eff}$ is not a function of frequency, the Q-value is frequency dependent and therefore the FOM (Factor of Merit) is also a function of frequency. Hence the FOM is more commonly used in filter design than in the resonator design.

Depending on the application, often device designers can tolerate a lowering in the $K^2_{eff}$ to achieve a high Q factor where a small sacrifice in $K^2_{eff}$ gives a large boost in the Q value. However, the opposite approach of sacrificing Q-value to obtain a design having an adequate $K^2_{eff}$ is not feasible.

$K^2_{eff}$ can be enhanced by choosing a high acoustic impedance electrode, and can also be traded off with other parameters such as electrode thickness and a thicker passivation layer.

There are two main types of BAW resonators (and thus filters): SMR (solidly mounted resonators) and FBAR (Film Bulk Acoustic Resonator resonators.

In the SMR resonator, a Bragg reflector is created under the bottom electrode using a stack of alternating low and high impedance thin film layers, each having a thickness $\lambda/4$, where $\lambda$ is the wavelength of the target frequency. The Bragg reflector stack acts an acoustic mirror to reflect the acoustic wave back into the resonator.

SMR resonators are easier (and thus typically cheaper) to manufacture than FBAR resonators and since the piezoelectric film is attached directly to the substrate, heat is dissipated more effectively. However, in SMR based filters, only the longitudinal acoustic wave is reflected, but not the shear waves. Consequently SMR filter designs have lower Q factors than FBAR based filters.

In the FBAR resonator a free-standing bulk acoustic membrane which is supported only around its edge is used. An air cavity is provided between the bottom electrode and the carrier wafer. The high Q factor of the FBAR is a great advantage over the SMR.

The Commercial FBAR filter market is dominated by Broadcom™ (previously AVAGO™) which uses Aluminum Nitride (AlN) as the piezoelectric thin-film material that best balances performance, manufacturability and Wafer Level Packaging (WLP) processing that employs Si cavity microcapping over the FBAR device with TSV (through silicon via) for flip chip electrical contacts. AlN has the highest acoustic velocity for a piezoelectric film (11,300 m/s) and hence requires a thicker film for a given resonance frequency which eases process tolerances. Furthermore, high quality sputtered AlN films with FWHM (Full width at half maximum XRD peak) of less than 1.8 degrees allow $K^2_{eff}$ values that are above 6.4% which is conveniently about twice the transmit band for FCC mandated PCS. With Q values reaching 5000, FOM values of 250 to 300 are achievable, representing best in class filter devices. $K^2_{eff}$ must be kept constant to meet the band requirement. Consequently, to improve the FOM of a filter generally requires increasing the Q value.

Despite the high performance of the above mentioned FBAR filters, issues still remain that prevent moving forward to the next generation of wireless communication. The greater number of users sending and receiving more data results in increasingly jammed bands. To overcome this, future bandwidths should be more flexible to adapt to agile arrangements of different bands. For example, The 5 GHz WiFi band has 3 sub-bands located at 5.150-5.350 GHz, 5.475-5.725 GHz, 5.725-5.825 GHz, respectively, corresponding to required $K^2_{eff}$ of around 7.6%, 8.8% and 3.4%. The coupling coefficient $K^2_{eff}$ is mainly decided by the intrinsic nature of the piezoelectric material, but is affected by the crystalline quality and orientation of the piezo film, by exterior capacitors and inductors and by the thickness of the electrodes and other stacked materials. The bandwidth of AlN FBARs is mainly modulated by inductors and capacitors that are pre-integrated into the IC substrate carriers. However, these elements degrade the Q factor and also increase the substrate layer count and thus the size of the final product. Another approach for $K^2_{eff}$ modulation is to use an electrostrictive material to realize tunable band FBAR filters. One candidate material is $Ba_xSr_{1-x}TiO_3$ (BST) that may be tuned once the DC electrical field is applied Tunability with BST can also be achieved by using it as a variable capacitor build in part with the FBAR resonators circuitry thereby assisting in matching filters and in adjusting their rejection. Furthermore, since a BST FBAR resonates only with a certain applied DC bias voltage, it may represent low leakage switching properties, potentially eliminating switches from the Front End Module (FEM) of the mobile device and thereby simplifying module architecture and reduce both size and cost. BST FBARs also possess other favorable properties for RF applications. The high permittivity of ferroelectric materials ($\varepsilon r>100$) allows for reduction in the size of devices; for example, a typical BST resonator area and BST filter area is in the order of 0.001 $mm^2$ and 0.01 $mm^2$, respectively, at low GHz frequencies in standard 50-$\Omega$ RF systems. In fact, using BST the resonator size may be an order of magnitude smaller than that of conventional AlN resonators. Moreover, the power consumption in the BST FBAR itself is negligible even with the usage of the above-mentioned DC bias voltage across the device due to a very small leakage current in the BST thin-film.

Strong c-axis texture is the most important prerequisite for AlN or BST based FBARs because the acoustic mode for such FBARs needs to be longitudinally activated, and the piezoelectric axis of both AlN and BST is along the c-axis. Hence high qualities single crystal piezo film, as represented by FWHM of less than 1°, have great impact on the FBAR filter properties and can reduce the RF power that is otherwise wasted as heat by as much as 50%. This power saving can significantly reduce the rate of drop calls and increase the battery life of mobile phones.

Epitaxial piezoelectric films with single orientation may have other merits. For example, strongly textured epitaxially grown single crystal piezo films are expected to have smoother surfaces than those of randomly oriented films. This in turn, results in reduced scattering loss and a smoother interface between the metal electrodes to the piezo films which both contribute to a higher Q-factor.

Furthermore, there is an inverse thickness to operating frequency relationship for AlN and BST filter films. Ultra thin-films are needed for extremely high frequency filters such as 5 GHz WiFi, Ku and K band filters. For filter operating at 6.5 GHz the thickness of BST film should be around 270 nm and for 10 GHz the thickness of an AlN film should be around 200 nm. These dimensions invokes serious challenges for film growth because it is hard to attain the necessary stiffness for an extremely thin anchored membrane and the crystalline defects and strains are more likely to cause cracks and mechanical failures as the membrane film becomes thinner. As such, more innovative membrane supporting structures with defect-free single crystal films are needed for the next generation of high frequency FBARs.

Unfortunately, AlN, BST and other piezoelectric materials have vast lattice spacing and orientation differences to that of silicon and those of currently used bottom electrode metals. Furthermore, the range of bottom electrode materials available, especially in the case of BST, is very limited since they have to withstand relatively high temperatures during the subsequent deposition of the piezo film thereupon.

An alternate approach to PVD deposited AlN to achieve higher $K^2_{eff}$ and thus FOM, is exploring the usage of higher quality single crystal AlGaN using Chemical Vapor Deposition (CVD). High resistivity silicon substrates with <111> orientation can be used as substrates for the deposition of such films thereon, and as is typical for III-N layer growth on silicon, a thin AlN layer may be used as a buffer layer to accommodate the large lattice mismatch between the substrate and the AlGaN film. Nevertheless, there is still a large difference in the Coefficient of Thermal Expansion (CTE) between AlGaN films and silicon which leads to the epitaxial layer being in tension at room temperature and this residual stress may result in the film cracking.

U.S. Pat. No. 7,528,681 to Knollenberg titled acoustic devices using an AlGaN region, describes a method of creating a single crystal film of AlGaN by epitaxially growing the thin film on a sapphire substrate and, after depositing a first electrode, the thin film is detached from the substrate using a laser lift-off process.

SUMMARY

An aspect of the invention is directed to a filter package comprising an array of piezoelectric films sandwiched between lower electrodes and an array of upper electrodes covered by an array of silicon membranes, which are themselves preferably single crystal silicon membranes with cavities thereover: the lower electrode being coupled to an interposer with a first cavity between the lower electrodes and the interposer; the array of silicon membranes, preferably constructed from single crystal silicon having a known thickness and attached over the upper electrodes with an array of upper cavities, each upper cavity between a silicon membrane of the array and a common silicon cover; each upper cavity aligned with a piezoelectric film, an upper electrode and silicon membrane, the upper cavities having side walls comprising $SiO_2$; the individual piezoelectric films, their upper electrodes and silicon membranes thereover being separated from adjacent piezoelectric films, upper electrodes and silicon membranes by a passivation material.

Typically the piezoelectric films comprises a material selected from the group consisting of $Ba_xSr_{(1-x)}TiO_3$ (BST), AlN and $Al_xGa_{(1-x)}N$.

Typically the piezoelectric films have a thickness of up to 2 microns.

Optionally the piezoelectric films each comprise a single crystal.

Typically the lower electrodes comprise aluminum.

In some embodiments edges of the lower electrodes are stiffened by an under bump metallization material comprising a titanium adhesion layer followed by at least one of tungsten, tantalum and molybdenum.

In some embodiments an under bump metallization material comprising tungsten or tantalum connects the lower electrode to the copper pillars.

Typically the lower electrode is coupled to the interposer by solder tipped copper pillars.

Optionally the upper electrodes comprise at least one metal layer selected from the group comprising aluminum, titanium, tungsten, molybdenum, gold and gold-indium layers.

In some embodiments the upper electrodes are multilayer electrodes comprise at least one layer with a relatively low DC resistance and a second layer with a relatively high acoustic impedance.

Optionally the at least one layer with a relatively low DC resistance comprises aluminum and is proximal to the piezoelectric layer, and the second layer with a high acoustic impedance comprises tungsten or molybdenum that is further coupled to a bonding layer for attachment of the silicon membrane thereover.

In other embodiments, a single layer of tungsten, tantalum or molybdenum is deposited onto the piezoelectric layer on one side and a bonding layer is applied on the opposite side for attachment of the silicon membrane there-onto.

Optionally an adhesion layer is applied between at least one of the following list of adjacent layers: the piezoelectric layer and the relatively low DC resistance layer; the relatively low DC resistance layer and the relatively high acoustic impedance layer; the relatively high acoustic impedance layer and the bond layer and between the bond layer and the silicon membrane.

The adhesion layer is typically titanium.

In some embodiments the passivation material is selected from the group consisting of $SiO_2$, $Si_3N_4$, $Ta_2O_5$, polyimide and Benzocyclobutene (BCB).

Typically the upper cavities between the silicon membrane and the silicon handle have side walls comprising residual silicon oxide.

Typically the cavities are 3-10 microns deep.

Optionally the upper electrodes of the array of upper electrodes are separated from each other by a 3 to 10 micron wide band of the passivation material.

In some embodiments there is a first adhesion layer between the piezoelectric membrane and the lower electrode.

Typically the first adhesion layer comprises titanium.

Optionally the silicon wafer is attached to the upper electrode by an adhesion layer adjacent to the upper electrode, a bonding layer and a further adhesion layer attached to the silicon wafer thereby creating a composite electrode.

Typically the adhesion layer and further adhesion layer comprise Ti having a thickness in the range of 5 nm to 50 nm with 5% tolerances.

The bonding layer is typically selected from the group comprising Au—In alloy, Au and AlN.

Typically the silicon wafer has a thickness in the range of 1 micron to 10 microns and is coupled to the silicon cover by silicon oxide.

Typically the silicon cover is 90 microns thick but could be as much as 150 microns.

Typically the silicon cover over the cavity is perforated with through silicon via holes.

Typically the filter package is encapsulated in polymer over-mold/under-fill (MUF), wherein a barrier between the filter array and the interposer provides a perimeter wall of the lower cavity; the barrier comprising at least one of an SU8 gasket around the filter array that is attached to the lower electrode and an epoxy dam attached to the interposer.

Typically the interposer comprises at least one via layer and one routing layer of copper encapsulated a dielectric matrix.

Optionally the interposer comprises a polymer matrix selected from the group consisting of polyimide, epoxy, BT (Bismaleimide/Triazine), Polyphenylene Ether (PPE), Polyphenylene Oxide (PPO) and their blends.

In some embodiments, the interposer further comprises glass fibers and/or ceramic fillers.

BRIEF DESCRIPTION OF FIGURES

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In particular, it will be appreciated that the schematic illustrations are not to scale, and the thickness of some very thin layers is exaggerated. In the accompanying drawings:

FIGS. 9 to 12 and 14 to 54 are schematic representations of the build up achieved by the steps of flowchart of FIGS. 8 and 9.

DESCRIPTION OF EMBODIMENTS

Figure 1:
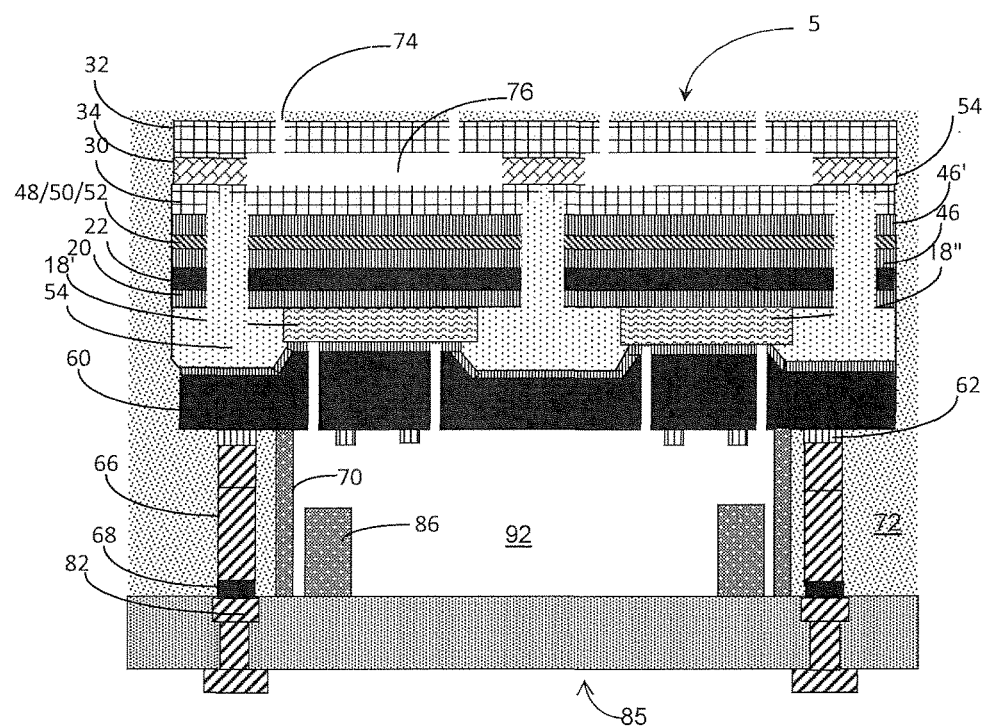
FIG. 1 is a schematic not-to-scale cross section representation of a Composite FBAR filter module which combines a plurality of Composite FBAR resonators coupled in half ladder or lattice arrangements or combinations thereof.
Figure 8A:
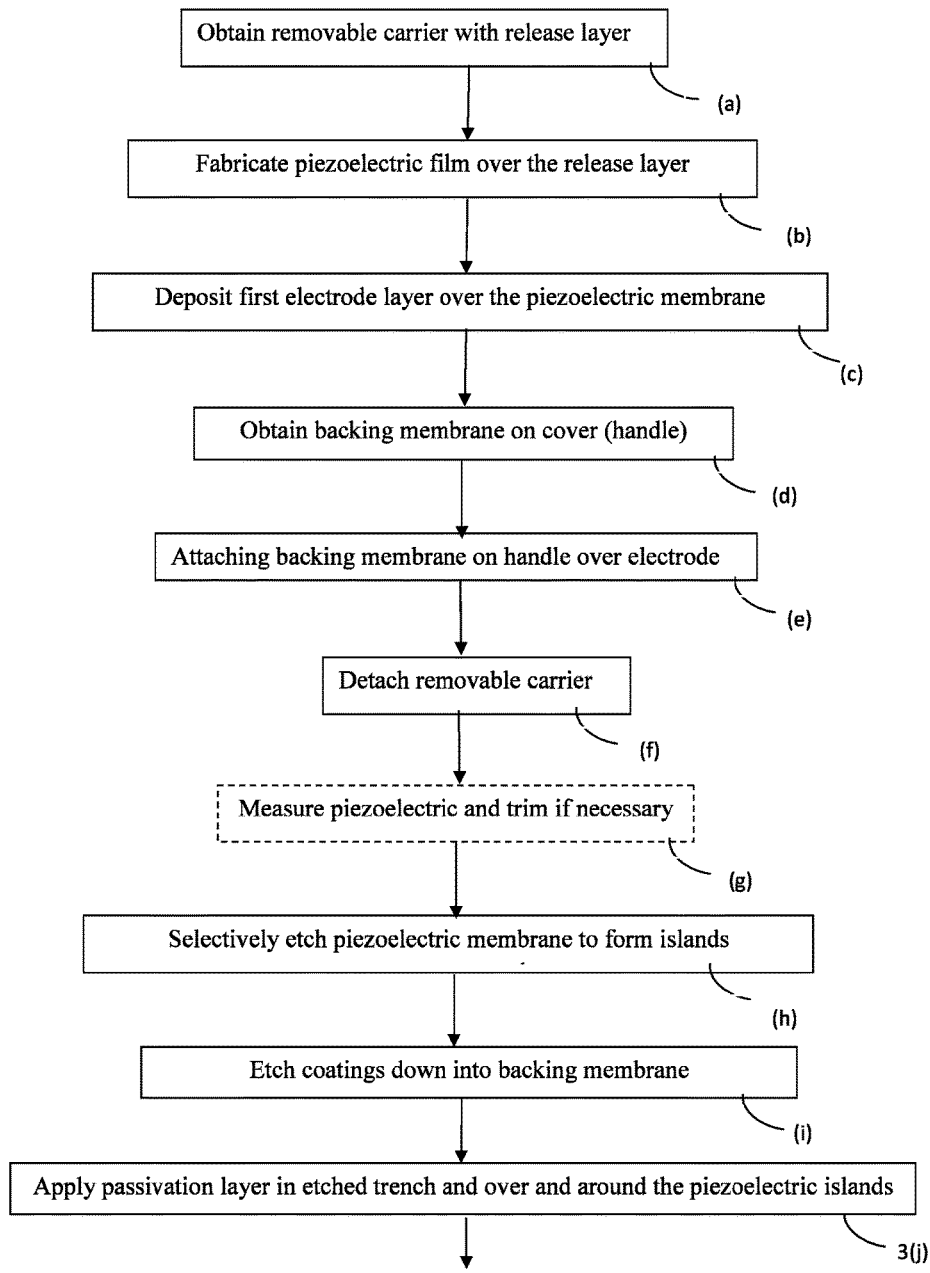
FIG. 8 is a flowchart illustrating a method of fabricating the Composite FBAR structure of FIG. 1.
Figure 8B:
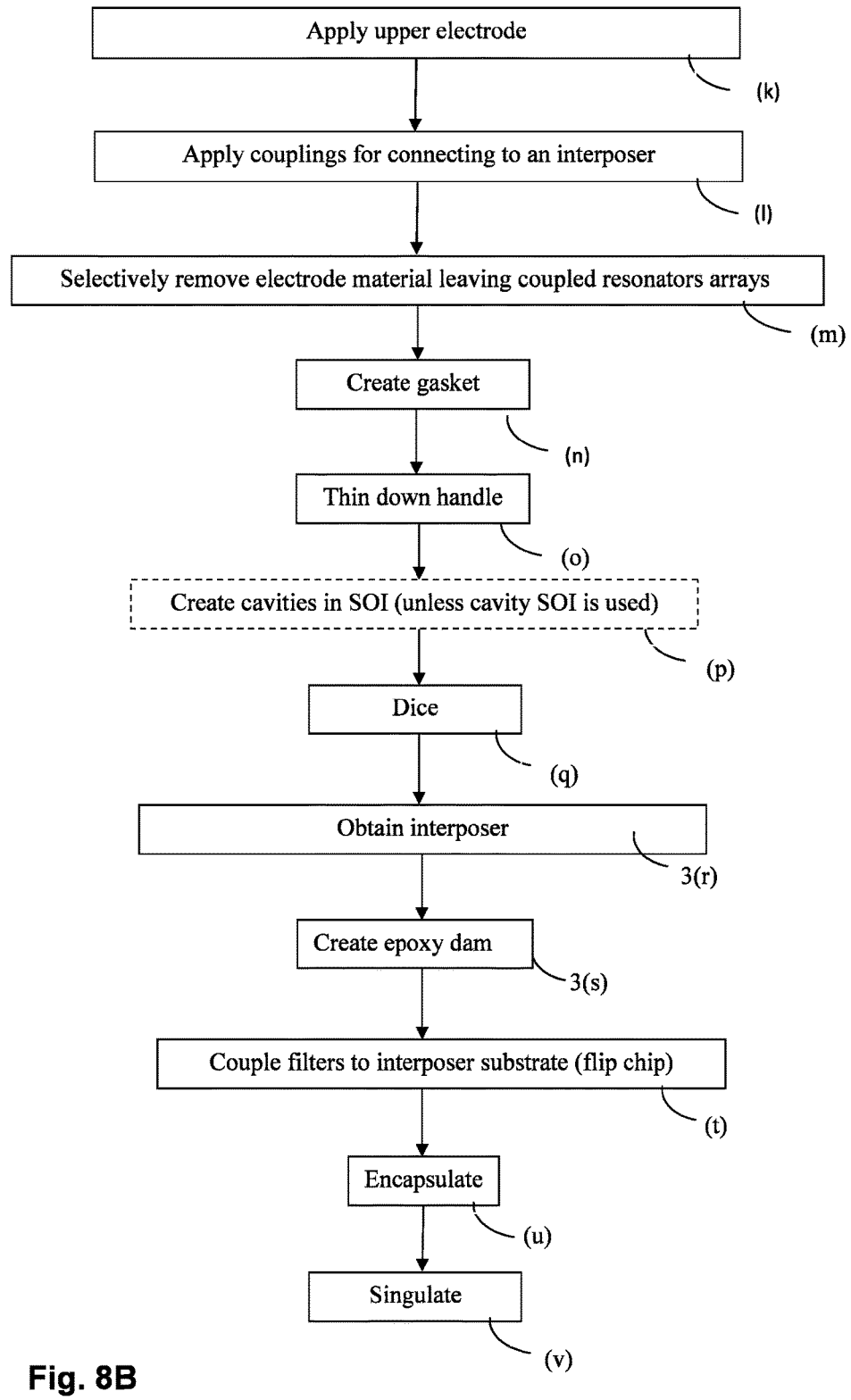

By way of example, a design for a Composite FBAR filter module with single crystal $Ba_xSr_{(1-x)}TiO_3$ (BST), AlN or $Al_xGa_{(1-x)}N$ piezoelectric resonators is detailed hereunder with reference to FIG. 1, together with methods of manufacture with reference to FIG. 8.

With reference to FIG. 1 a Composite FBAR filter module 5 is schematically shown. The filter module 5 comprises a plurality of composite FBAR resonators coupled in half ladder or lattice arrangements or combination thereof. The composite FBAR resonators consist of piezoelectric films 18', 18" that may be $Ba_xSr_{(1-x)}TiO_3$ (BST), AlN or $Al_xGa_{(1-x)}N$ separated by a passivation material 54 such as $SiO_2$, $Si_3N_4$, $Ta_2O_5$, polyimide and Benzocyclobutene (BCB) and sandwiched between electrode 22, 60.

In the method of construction described hereinbelow, it will be noted that both top and bottom electrodes 22, 60 are deposited onto the piezoelectric material 18 rather than by depositing a piezoelectric material on top of an electrode which is currently standard practice for FBAR filter construction. This enables a wider range of metals such as aluminum to be used as the bottom electrode; aluminum having increased conductivity and being less dense, enables decreasing the electrode weight and the subsequent mechanical damping it causes to the resonator. The upper electrode may be a composite electrode comprising a number of different metal layers including the silicon film 30. However, the electrode resonator material 18 is typically coupled to the silicon film 30 that is preferably single crystal silicon by other layers of upper electrode including a bonding layer (48, 50), adhesion layers 46, 46' and often by a relatively low DC resistance layer and a relatively high acoustic impedance layer.

Thus, in addition to the silicon membrane 30, the upper electrode typically includes titanium adhesion layers, a relatively low DC resistance layer of aluminum, a relatively high acoustic impedance layer of tungsten or molybdenum and gold 50 or gold-indium 48 bonding layers. The silicon film 30 is typically a single crystal silicon and may have any of the following orientations, <100>: <111> and <110>. It typically has a thickness of 1 to 2 microns, but could be up to 10 microns thick. The single crystal silicon film 30 provides a mechanical support layer that has low acoustic losses and is itself attached by a layer of silicon oxide 34 using SOI technology to a cover 32 that is a thicker silicon wafer and is also known as a 'handle', providing a 'wafer on handle'. Cavities 76 are provided within the silicon oxide layer 34 opposite the piezoelectric resonator films 18. The depth of the cavities is typically 4 to 10 microns. The bonding between the electrode 22 and the silicon film 30 may be achieved in a number of ways, such as by a gold-indium eutectic 48, a gold layer 50 or an AlN layer 52.

A metallic adhesion layer becomes part of the upper electrode. Thin layers of one of these bonding materials may be attached to both the piezoelectric material 18 or first metallic layers thereupon, and to the silicon film 30 by adhesion layers 46, 46' such as titanium and then the thin layers of the bonding material are fused together.

The coated piezoelectric resonator array is attached to an interposer 85 by interconnects comprising solder 68 capped copper pillars 66, and is encapsulated in a polymer underfill/over-mold 72. A gasket 70 is provided around the filter, between the interposer 85 and the lower electrode 60 around the resonator array that defines the filter. The gasket 70 may consist of SU-8 attached to the lower electrode 60 and an epoxy dam 86 may be built up from the interposer 85. The gasket 70 and epoxy dam 86 work together to prevent the underfill/over-mold 72 that seals the unit from penetrating under the resonator array and define a cavity 92 between the lower electrode 60 and the interposer 85. Additional cavities 76 are provided over the piezoelectric films 18', 18" in the space between the silicon membrane 30 and cover 32, by selective removal of the silicon dioxide 34 by etching. A passivation material 54 separates the upper electrode 22, adhesion layers 20, 46, 46', bonding layers 48/50/52 and silicon membrane 30 into separate regions supporting pairs of parallel resonators and separating resonators that are connected in series.

An Under Bump Metallization (UBM) Layer 62 that comprises tungsten or tantalum or molybdenum (possibly with an adhesion layer of titanium), enables fabrication of the copper pillars 66 on the underside of the bottom electrode 60. Other remnants of the UBM 63 serve as stiffening "raised frame" around the perimeter of the lower electrode 60, which, being aluminum, has a very low weight. This "raised frame" structure is especially useful in Composite FBARs as it helps minimize lateral-wave spurious modes that otherwise lower the Q factor of the device, regardless of the mode number. With such a raised frame, only the main lateral mode is excited due to the new boundary conditions between the active and outside region of the resonator membrane 18 that are created by the raised frame 63. Additionally, with reference to FIGS. 2 to 7, it will be noted that filters comprise shunt resonators and series resonators. The extra weight of the UBM 63 layer on the electrode creates a mechanical damping effect that can assist in lowering the shunt resonator frequency response vs. the series resonator frequency response and thus improve the overall performance of the filter.

The Commercial FBAR filter market is dominated by Broadcom™ which uses Aluminum Nitride (AlN) as the piezoelectric thin-film material that best balances performance and manufacturability.

Embodiments of the technology disclosed herein below use AlN or $Al_xGa_{(1-x)}N$ or $Ba_xSr_{(1-x)}TiO_3$ (BST), which is expected to have fairly high Q and better $K^2_{eff}$ values.

Because the fabrication method allows single crystal piezoelectric films to be fabricated, improved factors of merit (FOM) are expected when compared to the polycrystalline non-epitaxially grown films currently in use.

Figure 2:
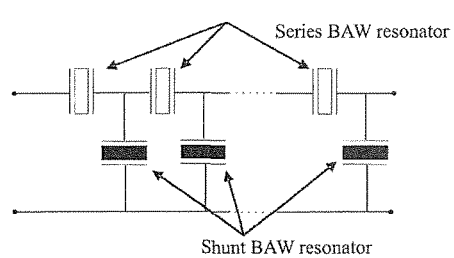
FIG. 2 is a simplified circuit of a ladder type RF filter configuration.
Figure 3:
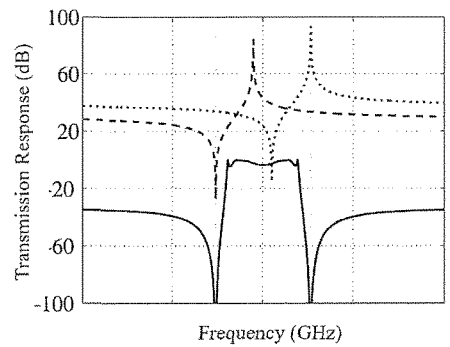
FIG. 3 is a graph showing the transmission response of the ladder filter configuration of FIG. 2.
Figure 4:
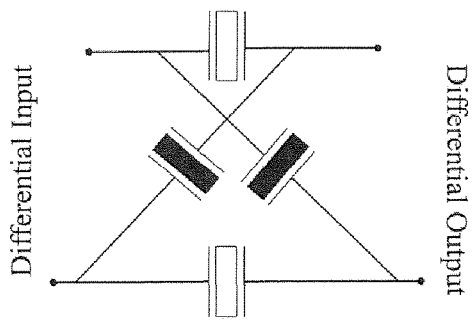
FIG. 4 is a is a simplified circuit of a lattice type RF filter configuration.
Figure 5:
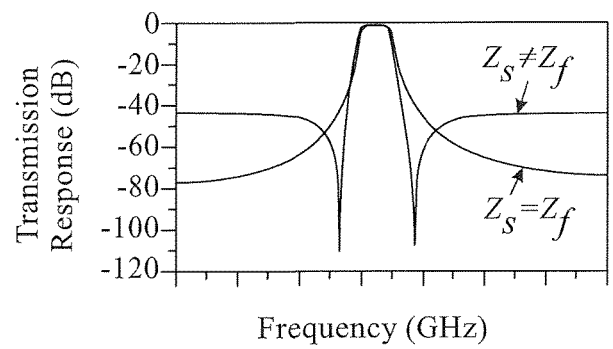
FIG. 5 is a graph showing the transmission response of the lattice type filter configuration of FIG. 4.

With reference to FIG. 2, a simplified circuit of a half ladder type filter configuration created by BAW resonators in series with shunt BAW resonators is shown. In a filter, resonators are combined in a 'ladder', wherein each 'rung' or 'stage' comprises two resonators: one in series and the other connected in shunt. With reference to FIG. 3, adding rungs to the ladder, improves the rejection of undesired frequencies, creating a signal with less out-of-band rejection (a steeper skirt) but this is at the expense of insertion loss and greater power consumption. With reference to FIG. 4, another resonator configuration may be a "lattice", which, as shown in FIG. 5 has poorer cutoff but better out-of-band attenuation.

Figure 6:
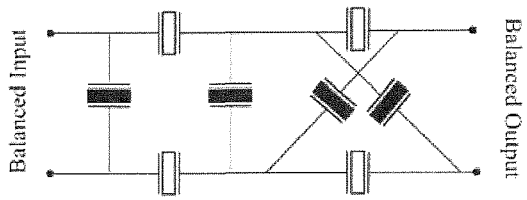
FIG. 6 is a simplified circuit of a combined ladder and lattice type RF filter configuration.
Figure 7:
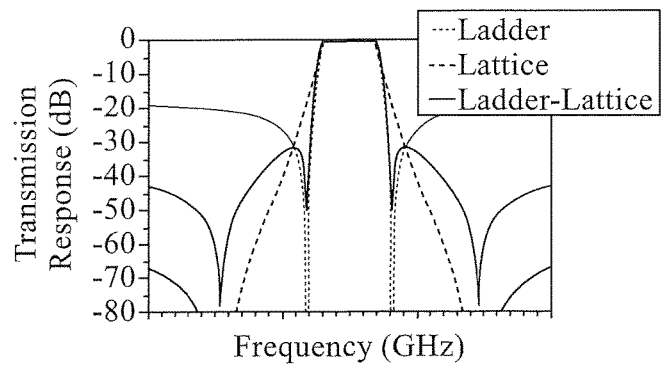
FIG. 7 is a graph showing the transmission response of the filter configuration of FIG. 6.

With reference to FIG. 6, the ladder and lattice type circuits may be combined to provide the transmission response shown in FIG. 7. The possible arrangements of resonators to create filters is beyond the scope of this application, but methods for fabricating resonators that are coupled in series and parallel are discussed hereunder with reference to FIGS. 42 and 43 and this enables arranging the resonators in the various ladder, lattice and combination arrangements.

Referring back to FIG. 1, in preferred embodiments, the resonator film 18 is a single crystal piezoelectric of (BST Al$_x$Ga$_{(1-x)}$N) or AlN.

Ba$_x$Sr$_{(1-x)}$O$_3$ (BST) is tetragonal. <111> single crystal BST may be deposited onto Al$_2$O$_3$ single crystal substrates.

AlN and AlGaN are HCP type Wurtzite crystal structures (C plane orientation). A strong C axis texture is the most important prerequisite for AlN and AlGaN FBAR filters because the acoustic mode of the FBAR needs to be longitudinally activated and the piezoelectric axis of AlN and AlGaN is along c-axis. The addition of gallium to AlN makes it easier to match lattice spacing of the film with that of the substrate.

Since there are no grain boundaries in a single crystal, the attenuation of the acoustic signal is minimal. This also minimizes the lost energy that is otherwise transferred into heat and which has to be dissipated.

Single crystal and strongly textured Ba$_x$Sr$_{(1-x)}$TiO$_3$ (BST), AlN and AlxGa(1-x)N films have smoother surfaces than randomly oriented films. This results in reduced scattering loss and higher Q-factors. Furthermore, rough surfaces, especially at high frequencies, are a major cause of the loss of the metal electrodes interfaces because of a skin effect. The smooth electrode—piezolelectric interfaces obtainable in highly textured and single crystal films with both upper and lower electrodes deposited thereupon are thus extremely advantageous.

Composite FBAR structures consist of a thin piezoelectric film 18 sandwiched between top and bottom electrodes 22, 60. In the past, the electrode 22 was first deposited and then the piezoelectric layer 18 was fabricated thereupon. This required the electrode 22 to be made from a heavy metal such as platinum, molybdenum, tungsten or gold, which allow the high deposition temperatures required for subsequent piezoelectric film deposition thereupon. However, most of these metals have poor DC resistance, potentially deteriorating the Q factor of the resonator. In preferred embodiments described herein the electrodes 22, 60 are deposited onto the piezoelectric film 18 using physical vapor techniques. This enables lightweight metals such as aluminum to be used, either on its own or in conjunction with other metal layers to form composite electrodes. Aluminum has a high conductivity and so a thinner electrode is possible. Aluminum is much less dense than refractory metals and so the weight of the electrodes and their damping effect is less. The quality and coupling of the resonators and filters thus formed are vastly superior to those of the prior art.

Aluminum is expected to readily adhere to AlN and AlxGa(1-x)N due to the Al ions of the piezoelectric film. If, however, electrode adhesion proves difficult, an adhesion layer which adheres to both the single crystal and to the electrode may be used. For example, titanium may be appropriate. Such adhesion layers typically have thickness of tens of nanometers.

The mechanism used in ferroelectric Composite FBAR transducers is electrostriction which is the electric field induced piezoelectric effect. The top and bottom electrodes 22, 60 are used to apply direct current (DC) and radio frequency (RF) signals. The preferred Composite FBAR structure described herein consists of a thin film single crystal Ba$_x$Sr$_{(1-x)}$TiO$_3$ (BST), AlN and Al$_x$Ga$_{(1-x)}$N film 18 sandwiched between top and bottom aluminum electrodes 22, 60. The AlN or Al$_x$Ga$_{(1-x)}$N film 18 converts mechanical to electrical energy and vice versa.

To provide stiffening without substantial weight, a low acoustic-loss single crystal silicon membrane layer 30 with possible orientation of <111>, <100> or <110> may be coupled to the piezoelectric films 18. The silicon layer 30 may have a thickness in the range of 1 μm to 10 μm, with the lowest possible thickness being preferable for best performance high frequency resonators. It should be noted that in Composite FBARs there are odd and even resonance modes, where each mode exhibits peak Q and $K^2_{eff}$ Coupling as a function of the Ba$_x$Sr$_{(1-x)}$TiO$_3$ (BST), AlN and Al$_x$Ga$_{(1-x)}$N to silicon membrane thickness ratio. The peak $K^2_{eff}$ values decrease with mode number because the fraction of acoustic displacement across the Ba$_x$Sr$_{(1-x)}$TiO$_3$ (BST), AlN and Al$_x$Ga$_{(1-x)}$N is reduced. However, the peak Q factor values increase with mode number, since the fraction of acoustic displacement across the low loss silicon layer increases. Hence, careful selection of the resonance mode is required for optimal FOM and low thickness silicon membranes with low thickness BaxSr(1-x)TiO3 (BST), AlN and Al$_x$Ga$_{(1-x)}$N films are desired for higher frequencies filters. In should also be noted that higher harmonic modes naturally render a higher frequency for a given film thickness and this may alleviate the requirement for trimming. Consequently, operating an FBAR at its second or higher harmonic mode frequency can extend the FBAR operation frequency range, as long as its figure of merit (FOM) remains high. Cavities 76, 92 are provided above and below the piezoelectric 18 on silicon 30 combination. The structure is encapsulated with a polymer 72 and mounted on an interposer 85 and coupled thereto with copper pillars 66 that are typically about 40-50 μm wide and about 40 μm high and joined to upper contact pads 82 of the interposer 85 with solder 68. A polymer gasket 70 which may be fabricated from SU-8 to have a high form factor and/or a dam 86 (typically epoxy) may be provided around the perimeter of the filter structure to keep the polymer over-mold/under-fill (MUF) 72 from entering the lower cavity 92. The interposer 85 may be constructed using well established fabrication technologies.

The Composite FBAR shown in FIG. 1 has such a piezoelectric 18 on silicon membrane 30 Composite FBAR structure, preferably wherein the piezoelectric film 18 is a Ba$_x$Sr$_{(1-x)}$TiO$_3$ (BST), AlN Al$_x$Ga$_{(1-x)}$N and the electrodes 22, 60 are fabricated from lightweight aluminum.

Although RF resonators are primarily used as filters, they find other uses, including as sensors, for example. There is also interest in tunable resonators that can operate at different frequencies.

FIG. 8 shows the steps of the main process flow for fabricating an Composite FBAR filter, and schematic illustrations of the build-up are shown in FIGS. 9-12, 14-53.

Figure 9:
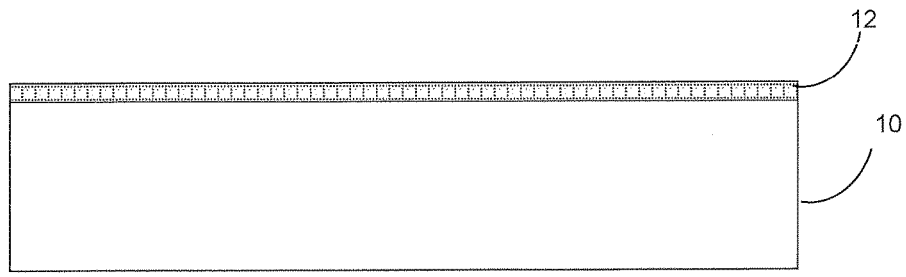

With reference to FIGS. 8 and 9, the method consists of first obtaining and providing a removable wafer carrier with a release layer—step (a), a schematic, not to scale representation of this is shown in FIG. 9 which represents a c-axis <0001>±1° Sapphire wafer 10 with an un-doped Gallium Nitride (U-GaN) release layer C-axis <0001>±1° 12 thereon. Such sapphire wafers 10 with U-GaN 12 deposited thereon are commercially available with diameters of 2", 4" and 6" in thicknesses of from 430 μm, and have a polished surface with an RMS smoothness of less than 1 nm. The U-GaN layer 12 typically has a thickness of 4 μm and a polished surface having an RMS of less than 1 nm ready for epitaxial growth thereon. These coated substrates were developed for the Light Emitting Diode (LED) industry and are commercially available from various Chinese manufacturers including San'an Optoelectronics Co., Ltd. (San'an) and Suzhou Nanowin Science and Technology Co., Ltd (NANOWIN)™.

Alternatively, an AlN single crystal wafer cleaved from a large single crystal such as a single crystal grown by the Czochralski method, and having an appropriate laser absorbing release film thereupon could be used.

Figure 10:
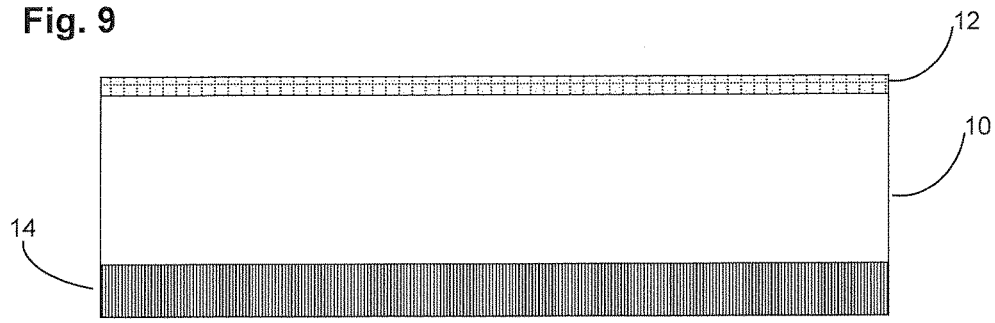
Figure 11:
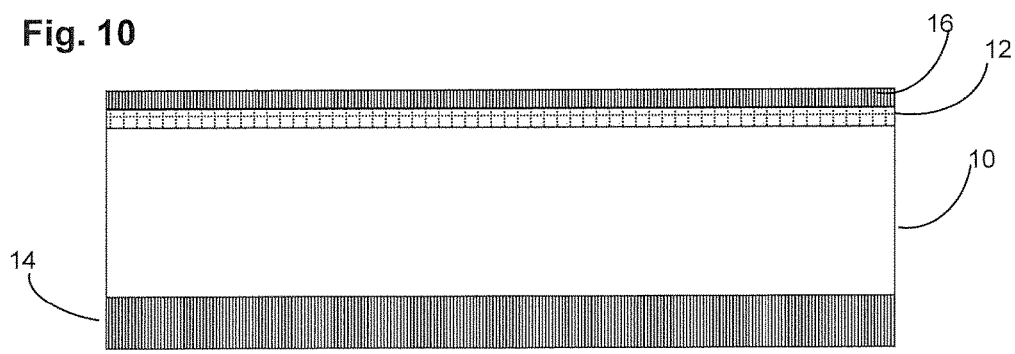

A piezoelectric film comprising BaxSr(1-x)TiO3 (BST), $Al_xGa_{(1-x)}N$ or AlN is now deposited onto the removable carrier 10—step (b). With reference to FIG. 10, to aid heat dissipation and thus thickness distribution during subsequent deposition of a $Ba_xSr_{(1-x)}TiO_3$ (BST), $Al_xGa_{(1-x)}N$ or AlN piezoelectric film, a metal layer 14 may deposited on the back of the sapphire wafer 10—step (bi), i.e. the side opposite to the side coated with GaN 12. The thickness of the metal layer 14 depends on the metal used. In this instance, with $Ba_xSr_{(1-x)}TiO_3$ (BST), $Al_xGa_{(1-x)}N$ or AlN piezoelectric material 18 subsequently deposited (see below) titanium is a good candidate for the heat dissipating metal layer 14, and an appropriate thickness for the heat dissipating layer 14 is about 150 nm. The heat dissipating metal layer 14 may be deposited by sputtering, for example.

The Gallium Nitride release layer 12 is typically about 4 nm thick with an RMS roughness of less than 2 nm. Because of the lattice matching between the <0001> plane of the GaN 12 and Sapphire 10, $Ba_xSr_{(1-x)}TiO_3$ (BST), $Al_xGa_{(1-x)}N$ or AlN may be laid down as a single crystal film. Adjusting the percentage of gallium helps ensure lattice matching and thin films having a thickness of between 100 nm and 2000 nm and typically 200-400 nm in the case of $Ba_xSr_{(1-x)}TiO_3$ and 200 nm to 2000 nm in the case of AlN or $Al_xGa_{(1-x)}N$ are then deposited in this manner using oxide molecular beam epitaxy (MBE) using effusion cells of barium, strontium and titanium or Al and Ga—step (b).

Molecular beam epitaxy (MBE) is a high purity low energy deposition technique that allows for low point defect manufacturing. It is possible to control the barium to strontium (or aluminum to gallium) ratio with high accuracy of ±1% and this affects the Q factor and coupling of the film.

The epitaxially grown $Ba_xSr_{(1-x)}TiO_3$ (BST), $Al_xGa_{(1-x)}N$ or AlN films may have a RMS roughness of less than 1.5 nm. This minimizes the so called ripple effect.

Figure 12:
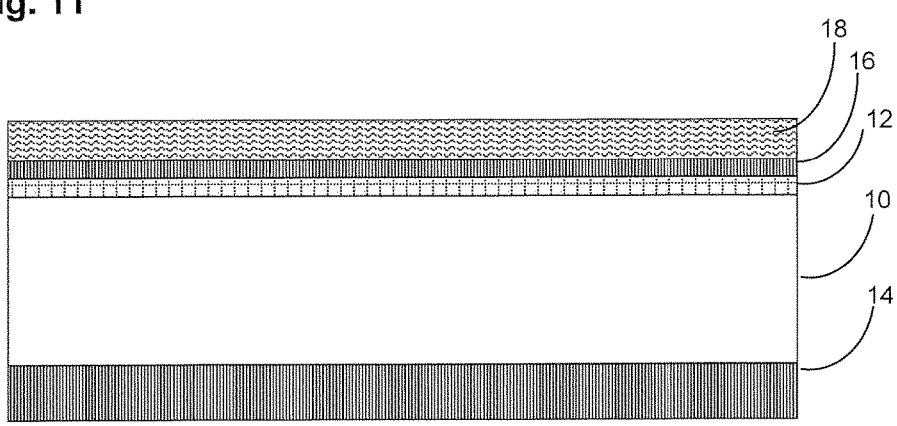

As shown in FIG. 12, to facilitate deposition of a single crystal piezoelectric layer 18 of $Ba_xSr_{(1-x)}TiO_3$, a buffer layer 16 of rutile $TiO_2$ and/or $SrTiO_3$ may first be deposited step b(ii).

Figure 13:
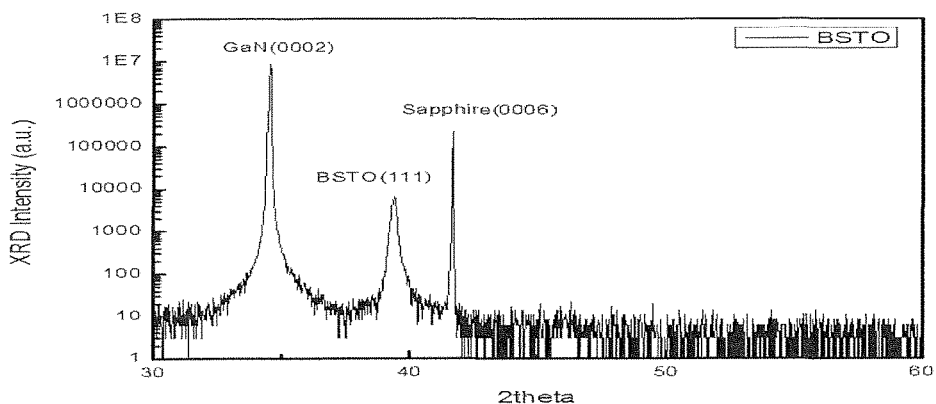
FIG. 13 is a 180° XRD spectrum of single crystal $Ba_xSr_{(1-x)}TiO_3$ (BST).

To the best of our knowledge, Applicant is the first person to create a single crystal layer of $Ba_xSr_{(1-x)}TiO_3$ and FIG. 13 is a 180° XRD spectrum of the structure of FIG. 12 showing that a single crystal membrane of BST was obtained.

However, It will be noted that commercially available $Al_xGa_{(1-x)}N$ thin films with x of 5, 10, 13, 20, 30, 50 and 100% and XRD FWHM of a fraction of a degree are available from various sources. For example single crystal Al0.2Ga0.8N with a c plane orientation <0002> having a thickness of 1 or 2 μm deposited on a 4 μm GaN release layer on a 4" sapphire substrate is available from Kyma Technologies™.

In prior art resonators, the lower electrode is first deposited and then the piezoelectric film is deposited thereon. Consequently, due to the high temperature fabrication of the piezoelectric film, refractory metals such as molybdenum, tungsten, platinum or gold are traditionally used for the lower electrode Since in the present technology, the first electrode 22 is deposited onto the piezoelectric film, a wide range of metals may be used such as aluminum. It will be appreciated that aluminum has a relatively low DC resistance when compared to these refractory metals, and thus using aluminum electrodes is expected to increase the Q factor of the filter.

Figure 14:
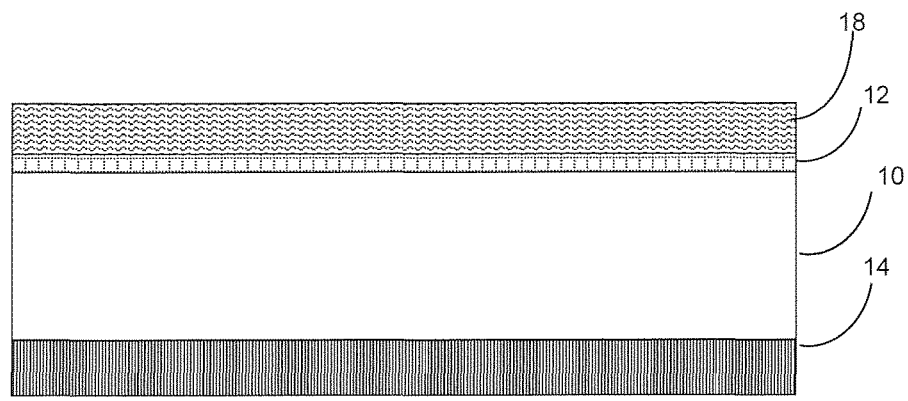
Figure 15:
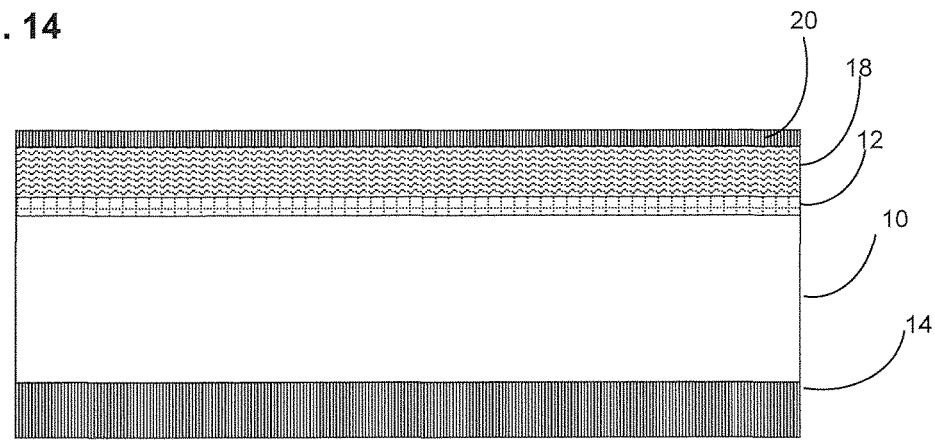

FIG. 14 shows the equivalent structure with a piezoelectric film 18 of $Al_xGa_{(1-x)}N$ or AlN without a buffer layer 16. For simplicity, the remaining structures shown in FIGS. 15 to 53 do not show the buffer layer 18.

Figure 16:
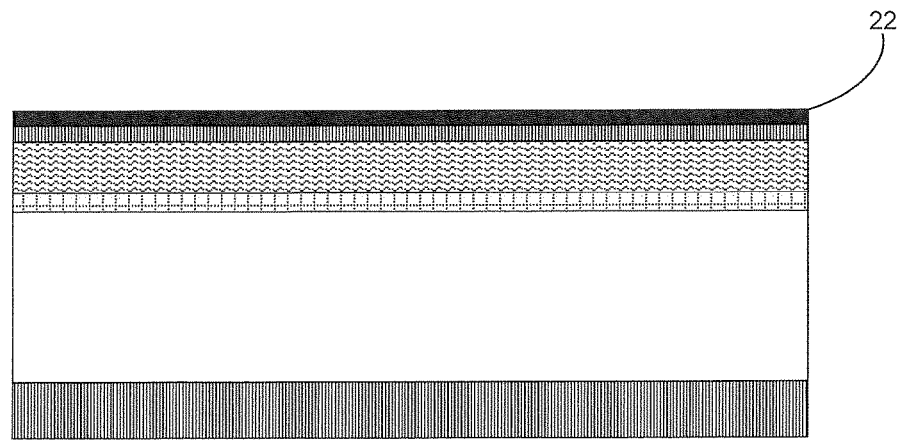

A first electrode layer 22 is now deposited over the piezoelectric membrane 10—step (c). With reference to FIG. 16, to aid adhesion, an adhesion layer 20 such as a titanium layer that may be as little as 5 nm thick, but could be as much as 50 nm is first deposited onto the piezoelectric membrane 18—step (ci). Then an aluminum electrode layer 22 having a thickness of, say, 50 nm to 150 nm is deposited thereover—step (cii). Both the adhesion layer 20 and the electrode layer 22 may be deposited by sputtering, for example. Tolerances of ±5% are acceptable and easily obtainable.

At a first approximation, the resonant frequency $f_R$ of a piezoelectric resonator is given by the following equation: $f_R = \upsilon/\lambda \approx \upsilon L/2t$ where $\upsilon L$ is the longitudinal acoustic velocity in the normal direction of the piezoelectric layer, t is the thickness of the piezoelectric film and $\lambda$ is the acoustic wavelength of the longitudinal wave.

However, in practice, the acoustic properties of the other layers of the resonator affect the resonator performance. In particular, the mass loading effect of the electrodes which tend to be made of heavy metals such as molybdenum and platinum, due to the need to withstand the fabrication temperature of the piezoelectric material.

Although described for depositing aluminum onto $Ba_xSr_{(1-x)}TiO_3$, $Al_xGa_{(1-x)}N$ or AlN, it will be appreciated that PVD or CVD with otherwise, low density, high conductivity electrode materials 22 over different piezo layers may be used with the same method. For example, carbon nano-tubes (CNT) over single crystal AlN or AlxGa(1-x)N may be considered. Aluminum is particularly attractive for resonator electrodes since it has high electrical and thermal conductivity and a low density, so hardly lowers the overall Q factor of the resonator. However, previous manufacturing routes wherein the electrode was deposited prior to deposition of the piezoelectric, ruled out aluminum. In this regard it will be noted that adding an aluminum bottom electrode after etching away a Si carrier wafer and exposing the back side of the piezoelectric layer, has significant yield challenges and complicates the packaging process of the filter and thus lowers the final yield.

The piezoelectric film 18, adhesion layer 20 and aluminum electrode 22 are deposited over the entire sapphire wafer 10 as a continuous layer.

A backing film on handle 28 is obtained—Step (d). This is a commercially available silicon on insulator (SOI) product. The backing film on handle 28 is typically a silicon wafer film 30 sandwiched to a silicon carrier 32 by a silicon oxide layer 34.

Figure 17:
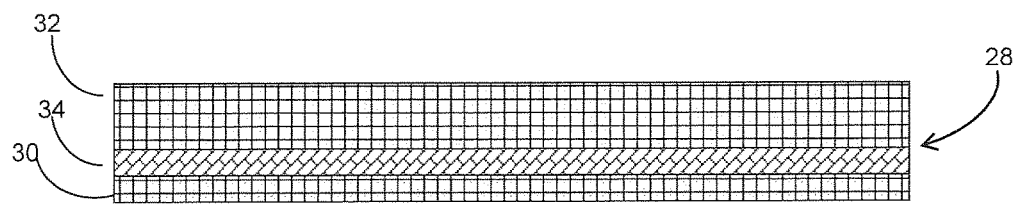

A commercially available backing film on handle 28 obtainable from KST World Corp™ (www.kstworld.co.jp) or OKMETIC™ (www.okmetic.com) that is suitable is shown schematically in FIG. 17 and consists of a silicon film 30 that comes in thicknesses in the typical range 1 to 10 μm that is coupled by a SiO2 box 34 that is typically 3-10 μm thick to a Silicon handle 32 that is typically at least 400 μm thick.

Figure 18:
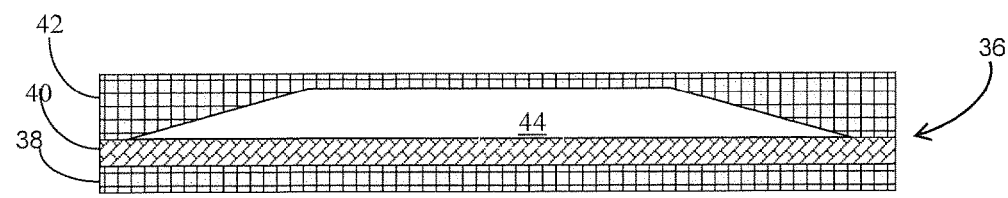

An alternative SOI product 36 shown in FIG. 18 is a silicon wafer 38 attached to a silicon carrier 42 by a silicon oxide layer 40, but with a preformed air cavity 44. Such a structure is commercially available from Icemos™ (www.icemostech.com).

Both SOI products 28, 36 may be obtained pre-coated with metal coatings on the silicon film 30, 38 aiding their attachment to the piezoelectric film—electrode sandwich.

Figure 19:
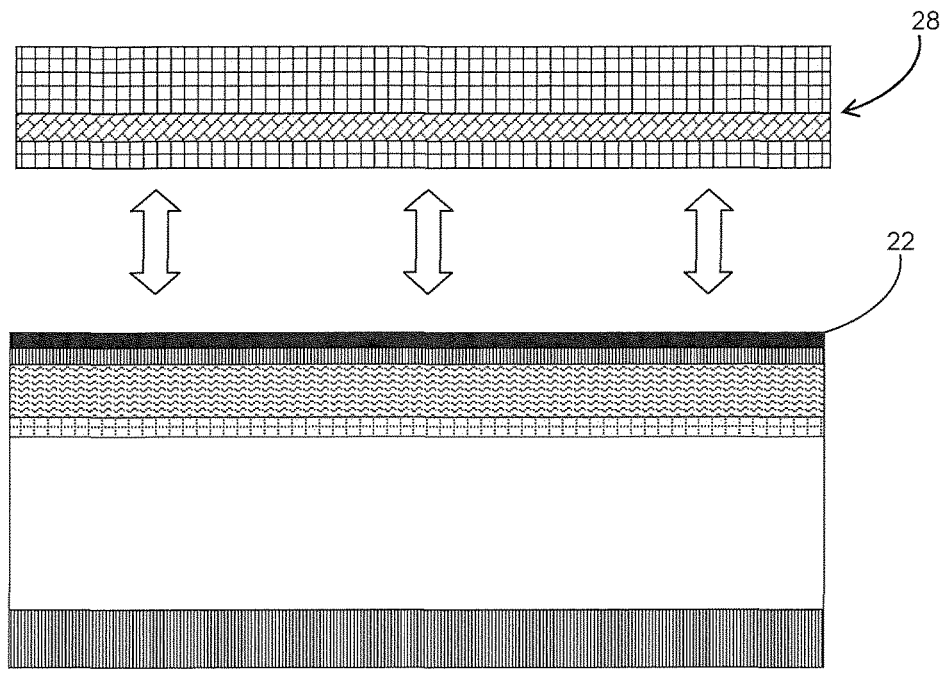
Figure 20:
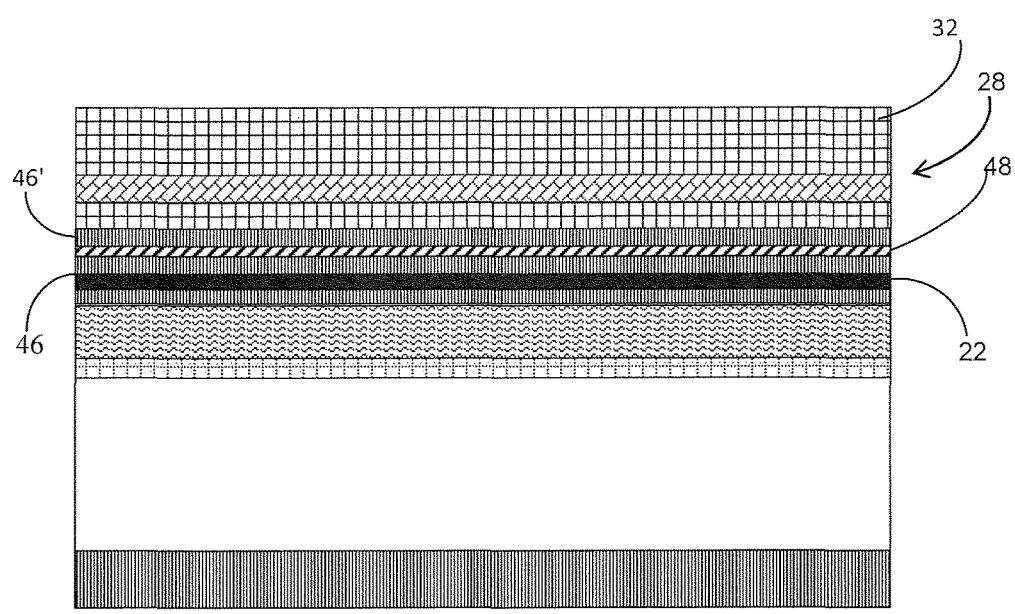

With reference to FIG. 19, the commercially available film 30 (38) on handle 32 (42) product 28 (36) is attached to the electrode 22 of the stack—step (e).

Figure 21:
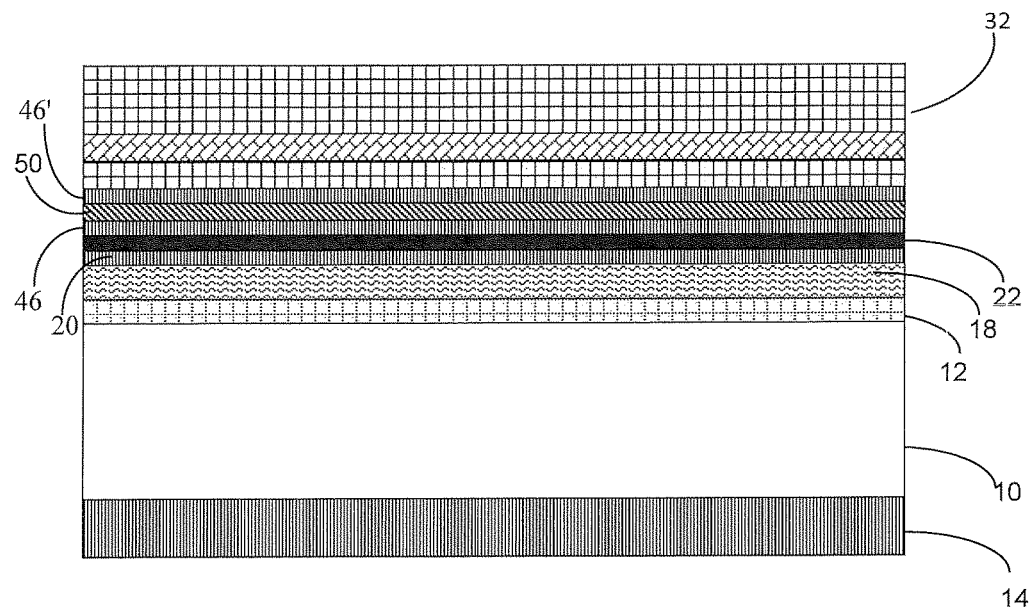

There are a number of ways that the silicon film 30 (38) may be attached to the electrode 22. For example, with reference to FIG. 20 an adhesion layer such as titanium 46 may be deposited onto the electrode layer 22 and this can be coated with an adhesive layer consisting of a gold-indium eutectic alloy 48 comprising 0.6% gold and 99.4% indium. The Au—In eutectic melts at 156° C. and by hot pressing at about 200° C., the adhesion layer may be attached to the silicon membrane 30 of the SOI wafer 28. Optionally, a titanium bonding layer 46' is attached to the silicon membrane 30 and an adhesive layer of gold-indium eutectic alloy 48 is attached to this. The two adhesion layers are fused together by the hot processing. The bonding layers created by this technique are rather thick, and the process is capable of some variation. With reference to FIG. 21, an alternative process relies on the fact that both the exposed surface of the silicon wafer film 30 (38) and the surface of the electrode layer 22 are very smooth. By coating both surfaces with adhesion layers of titanium 46, 46' that are typically 2-4 nm thick and may be deposited by sputtering, and then depositing pure gold 50 (50') coatings of thicknesses of 10-40 nm onto the adhesion layers 46 (46') the two gold coatings 50, 50' may be brought together at room temperature and the coatings fused together (see for example Shimatsu, T. & Uomoto, M. (2010). "Atomic diffusion bonding of wafers with thin nanocrystalline metal films". Journal of Vacuum Science Technology B: Microelectronics and Nanometer Structures. 28 (4). pp. 706-714.). This technique requires a lower temperature and a thinner gold layer 50 than the Au—In layer shown in FIG. 20.

Figure 22:
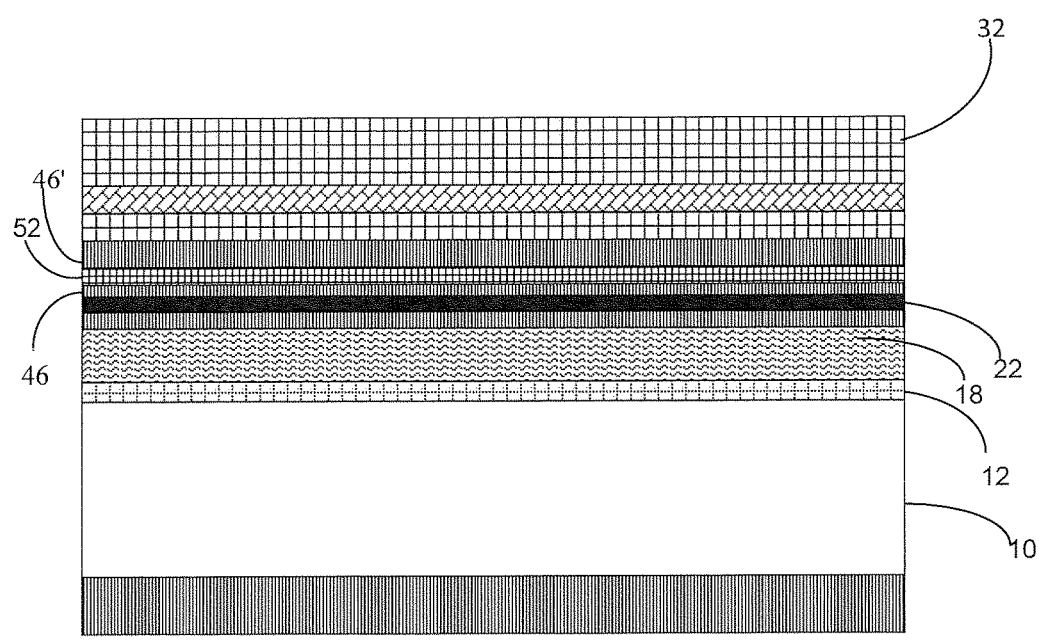
Figure 23:
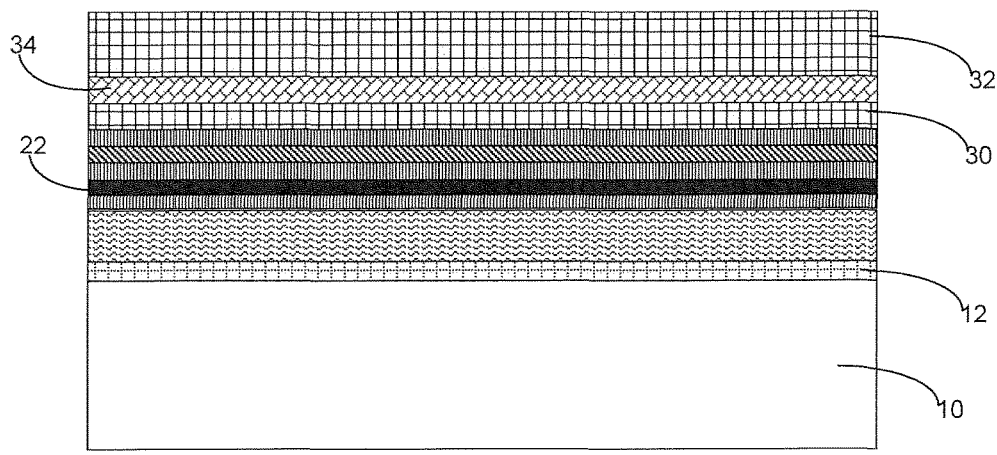
Figure 24:
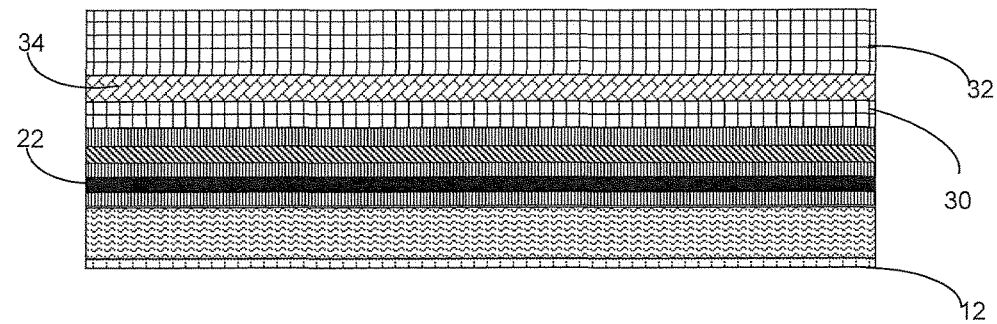

With reference to FIG. 22, a further alternative process is to again coat both surfaces with adhesion layers of titanium 46, 46' that are typically 2-4 nm thick, and then deposit aluminum nitride 52 (52') coatings having thicknesses of 10-40 nm onto the adhesion layers 46 (46'). The two aluminum nitride 52 (52') coatings may be activated with Ar plasma and when brought into contact at room temperature and pressure, fuse together. The bond can be strengthened by annealing at 300° C. in a N2 atmosphere, typically for a period of 3 hr.

It will be appreciated that the stack of titanium adhesion layers 20, 46, 46' and the gold-indium or gold bonding layers 48, 50 serve with the aluminum electrode 22 layer as the upper electrode. This composite electrode can take advantage of the inherent characteristics such as DC resistance, acoustic impedance and weight (density) of the different materials, to provide different properties to the composite electrode.

An alternative composite electrode may include an aluminum lower layer and gold-indium/gold/AlN bonding layers with an intermediate double layer of titanium and tungsten or titanium and molybdenum between the aluminum and the bonding layer. Titanium, tungsten and molybdenum may all be deposited by sputtering, and the titanium layer serves as an adhesion layer. The addition of a tungsten or molybdenum layer not only increases the acoustic impedance but additionally serves as a barrier layer between the gold of the bonding layer and the aluminum layer. In such a structure, the thickness of the aluminum layer may be as little as 50 nm. The titanium-tungsten or titanium-molybdenum is typically also 50 nm or slightly thicker. In such structures the gold bonding layer may be reduced to the minimum thickness that allows bonding while the aluminum, titanium-tantalum, titanium-tungsten or titanium-molybdenum serve as the main metals of the composite electrode, since they provide a desirable balance of low DC resistivity with high acoustic impedance.

In general, it is advisable to process at as low a temperature as possible to minimize the likelihood of damage to the piezoelectric film and its electrodes and to further minimize warpage of the stack due to differences in the coefficient of thermal expansion of silicon and sapphire. It is further advised that the bonding layer thickness should be as thin as possible in order to enhance the Q factor value but that higher bonding layer thicknesses are also possible thorough careful balancing of the DC resistance, weight and acoustic impedances of the composite electrode.

Once the silicon film and handle 28 is attached, the sapphire substrate 10 may be removed—step (f). If a thermal layer such as titanium 14 is deposited on the back of the substrate, this may be removed by chemical mechanical polishing, for example, giving the structure shown schematically in FIG. 23.

Then, the GaN 12 may be irradiated through the sapphire substrate 10 using a 248 nm excimer laser to disassociate the GaN 12 enabling lift off of the sapphire substrate 10. Such a pulsed laser, with a square waveform is available from IPG Photonics™. This process is known as laser lift off and results in the structure shown schematically in FIG. 24.

Figure 25:
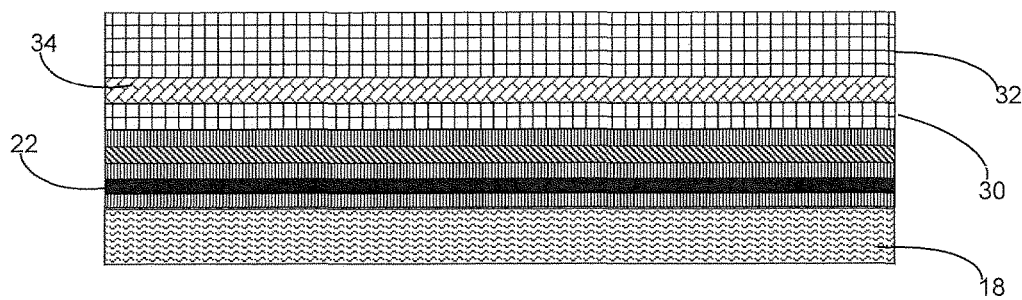

Residual GaN 12 may be removed using Inductively Coupled Plasma (ICP) with $Cl_2$, $BCl_3$ and Ar for example—FIG. 25. This can be achieved at temperatures of below 150° C., avoiding heat treatment of the piezoelectric thin film 18 and of the aluminum 22 and other layers. The Inductively Coupled Plasma (ICP) is a commercially available process, used by NMC (North Microelectrics) China Tool and by SAMCO INC™, for example.

After removing the GaN 12 a thickness measurement and trimming process of the piezoelectric film 18 may be required to obtain perfect frequency response which is related to the film thickness—step (g). The trimming process uses Ar+ Ion beam milling and this process may be used to tailor any metal adhesion, barrier or oxide layers such as $SiO_2$, $Al_2O_3$, AlN, W, Mo, Ta, Al, Cu, Ru, Ni or Fe where the wafers is held in a 4 axis chuck and rotated accordingly. A commercially available system known as InoScan™ is available from Meyer Burger™, Germany. A trimmed piezoelectric layer 18 is shown in FIG. 26 which is flipped over. It should be noted that in order to obtain high performance RF filters with a high yield, the thickness of the piezoelectric layer may need to be trimmed to tenths of a nanometer (single digit angstroms).

The same ICP process that is used to clean the back side of the piezoelectric 18 may then be used to pattern the piezoelectric layer 18 into arrays of piezoelectric islands for fabricating filters and the like—step (h). By way of example only, a schematic top view is shown in FIG. 27 and a side view in FIG. 28. Although rectangular islands of piezoelectric are shown, the islands may, of course, have any shape as dictated by the shape of the lithography mask tool. It will be noted that patterning the piezoelectric layer 18 into separate membranes just after the laser lift off processing reduces the risk of the piezoelectric layer cracking due to stress release across the wafer.

Figure 54:
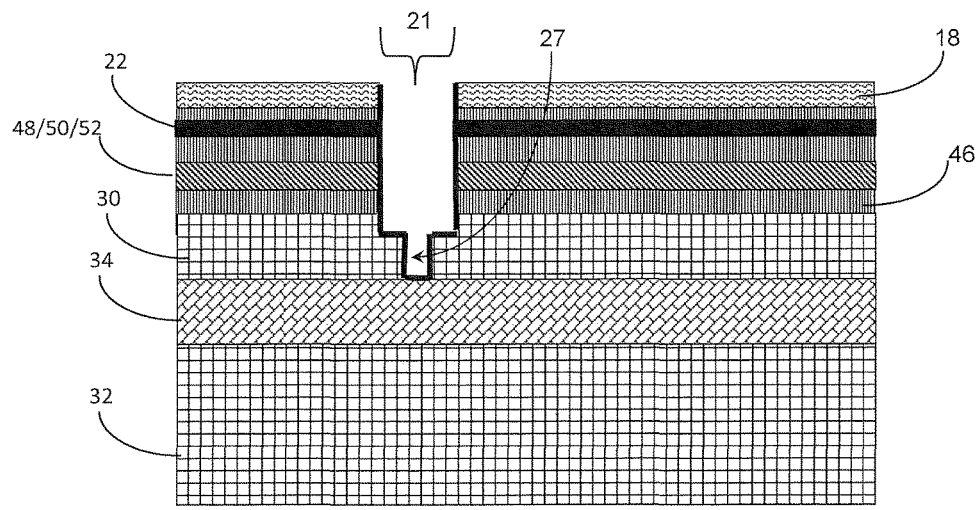

An induction coupled plasma (ICP) using $Cl_2+BCl_3+Ar$, $CF_4+O_2$ or $Cl_2+O_2+Ar$ and $SF_6+O_2$ is then applied to respectively remove the aluminum, adhesion layers, the high acoustic impedance layer, bonding layer and silicon membrane 30 down to expose the top surface of the silicon oxide 34 creating trenches 21—step (i). A top view of the structure is shown in FIG. 29 and a side view in FIG. 30. With reference to FIG. 54, usefully, the high acoustic impedance layer 22, bonding layer 48/50/52, adhesion layers 46 are traversed by the trench 21 created by the ICP which penetrates into the silicon membrane 30. Then the trench 21 is re-patterned with photoresist and a narrower trench 27 is etched through the rest of the silicon layer 30 into the silicon dioxide 34. This creates a stepped interface between the silicon membrane 30 and the subsequently deposited passivation layer 54 (see below) and enables secure anchoring of the passivation layer 54 to the silicon membrane 30 in step (j) since the surface of the interface can still be several microns, even if the silicon membrane 30 itself is only a micron or so thick. The silicon membrane 30 has to be fully traversed since silicon is a conductor, albeit not a particularly good one. The narrower trench 27 that separates the individual silicon membranes is typically 3 to 10 micron wide so that the individual silicon membranes are insulated from each other by a barrier of the passivation material 54 that is 3 to 10 microns wide.

The depth of the cavities is typically 3-10 microns as well.

The induction coupled plasma (ICP) process operates at a temperature of less than 150° C. and does not adversely affect the piezoelectric membranes 18', 18" which are protected by the photo-resist mask. Inductively Coupled Plasma (ICP) is a commercially available process, used by NMC (Beijing North Microelectronics) China Tool and by SAMCO INC™, for example.

A schematic top view of the resulting structure is shown in FIG. 29 and a schematic side view is shown in FIG. 30.

A passivation layer 54 such as $SiO_2$, $Si_3N_4$, or a photosensitive Polyimide or BCB (Benzocyclobutene) is applied into the trenches 21 thus produced—step (j). The same passivation material 54 may be used to cover the piezoelectric islands 18', 18" with windows then being opened down through the passivation layer to the piezoelectric islands. Where a photosensitive polyimide or BCB is used, this is achieved by selective exposure, which is a precision process that includes the known series of sub-processes such as spin-coat, exposure, development and cure of photo-sensitive polymer passivation layers. Photo-sensitive polyimide passivation materials are available from HD Microsystems™ and are a standard industry solution for Flip Chip and Wafer Level Chip Scale Packages (WL-CSP) devices such as that described in this specification. Photo-sensitive BCB is commercially available as Cyclotene™ from Dow Chemicals™.

$SiO_2$ and $Si_3N_4$ may be deposited using PE-CVD processes as known.

Figure 31:
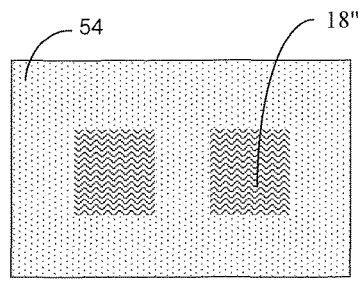
Figure 32:
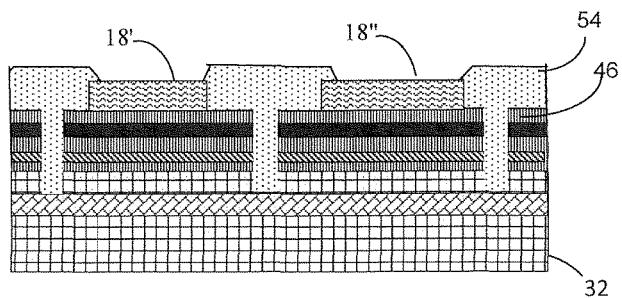
Figure 33:
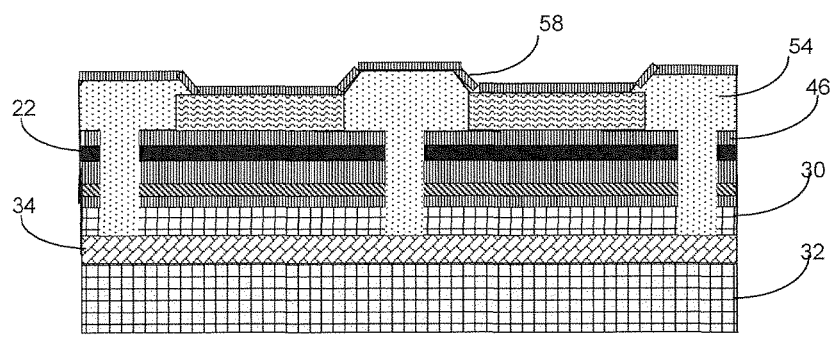
Figure 34:
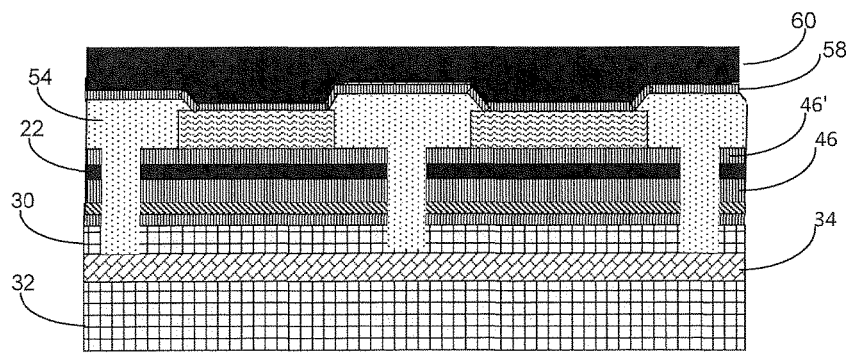
Figure 35:
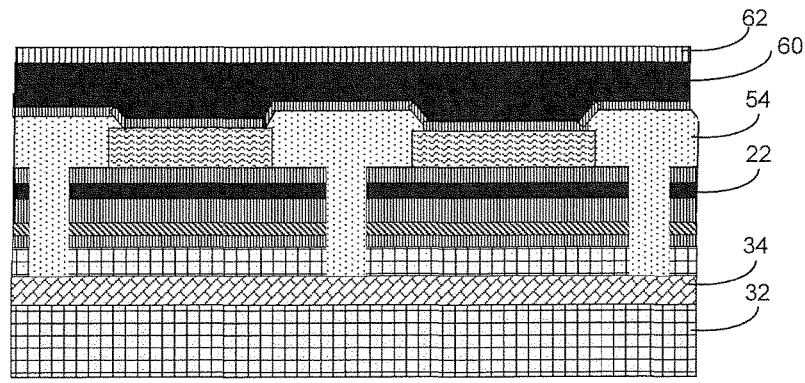

A schematic top view of the resulting structure is shown in FIG. 31 and a schematic side view is shown in FIG. 32.

The upper electrodes are now applied—step (k). An adhesion layer 58 such as titanium is first deposited—step 3 (ki)—FIG. 33, and then the top electrode 60 is then deposited—step (kii)—FIG. 34. Both the adhesion layer 58 and the electrode 60 may be deposited by sputtering, for example. Tolerances of ±5% are acceptable and easily obtainable.

Couplings are now applied to connect the structure to an interposer, described below. Firstly, an Under Bump Metallization (UBM) layer 62 may now be applied—step (l) by depositing a layer of metal that may be Ti/W, Ti/Ta or Ti/Mo (typically about 25 nm titanium, followed by about 50 nm of tungsten, tantalum or molybdenum—step (li), FIG. 35. Sputtering may be used.

Figure 36:
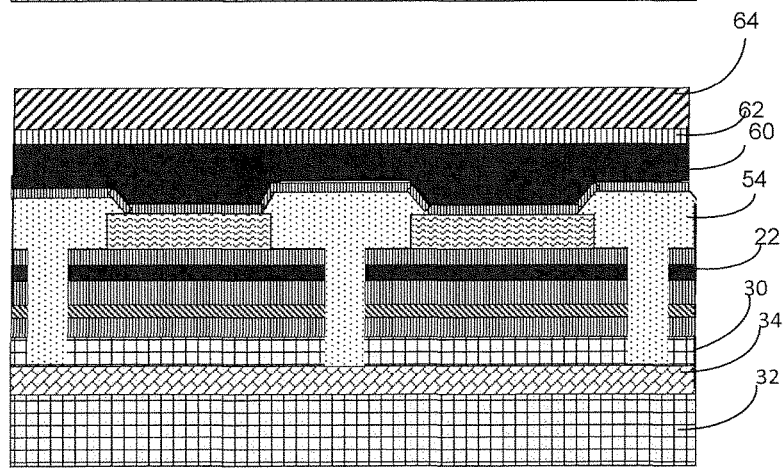

The structure may then be covered with a layer of copper 64 that is typically about 1 μm thick, by sputtering, for example—step (lii)—see FIG. 36; the Under Bump Metallization layer 62 keeps the copper 64 and aluminum 60 separate.

Figure 37:
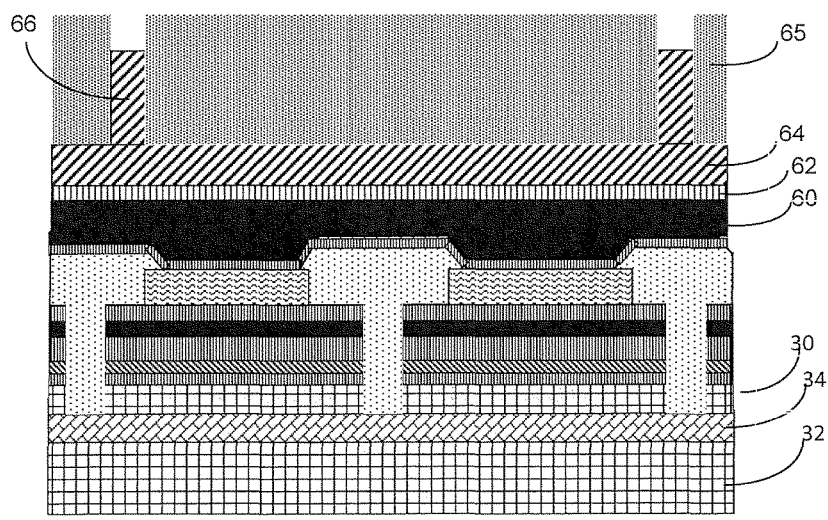

Next, copper pillars 66 may be fabricated—step (liii), FIG. 37. These are typically about 40-50 μm in diameter and about 40 μm high. They may be fabricated by depositing a layer of photoresist 65, patterning and then electroplating copper 66 into the pattern.

Figure 38:
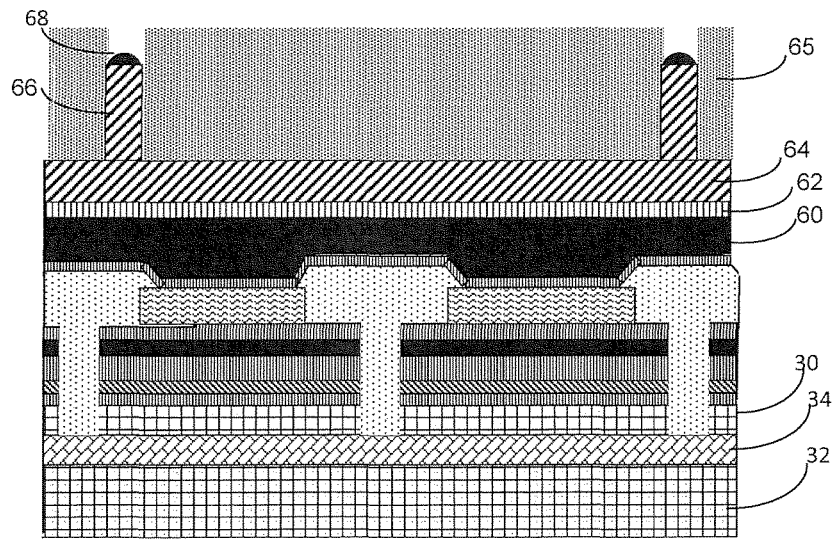
Figure 39:
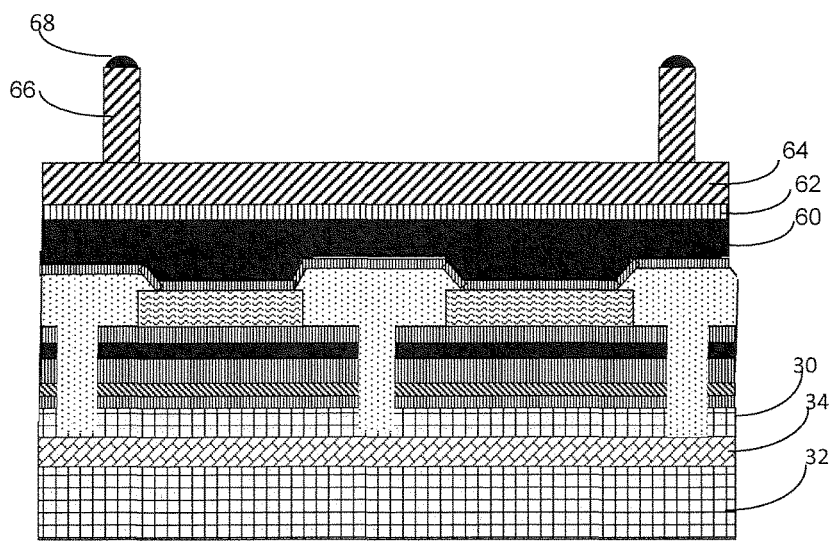

With reference to FIG. 38, solder 68 may then be deposited into the pattern to cap the copper pillars 66—step (liv). This could be achieved by electroplating or electro-less plating a suitable material into the photoresist pattern used for fabricating the copper pillars 66. Then the photoresist is stripped away—step (lv), FIG. 39.

Figure 40:
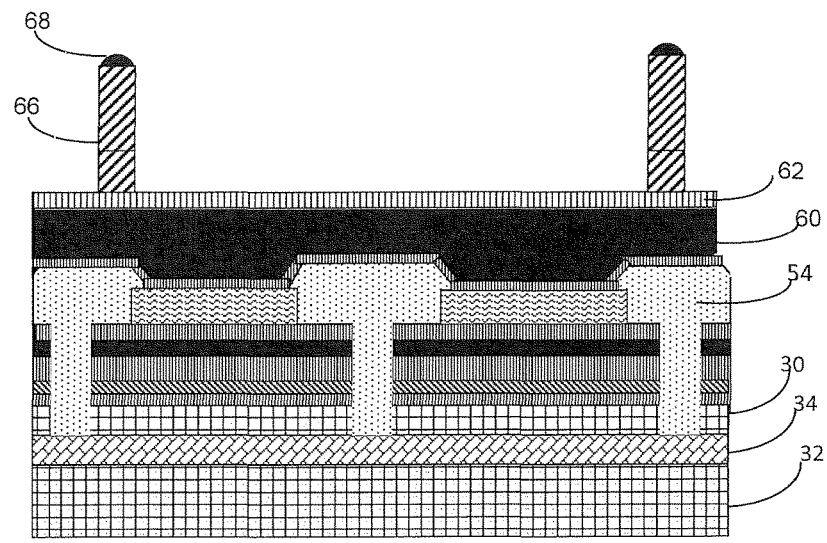
Figure 41:
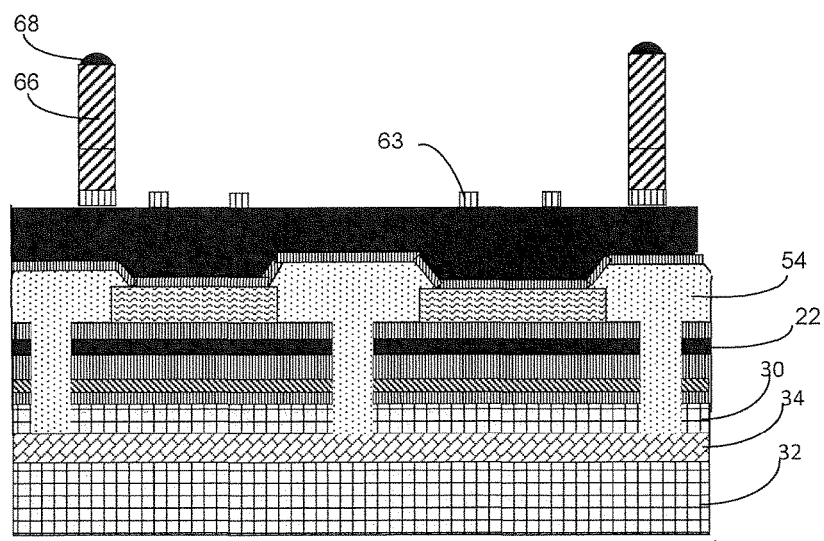

The copper layer 64 around the copper pillars 66 is now etched away—step (lvi), FIG. 40. This may be accomplished by exposing to a solution of ammonium hydroxide at an elevated temperature. Alternatively, copper chloride or other commercially available Cu micro-etch solution may be used as the etchant. The UBM 62 is now selectively removed—step (vii), FIG. 41, leaving perimeter sections 63 over what will become the edges of the upper electrode to add weight to the edges of the effective resonators. Such "raised frame" structure is especially effective in Composite FBARs to help minimize lateral-wave spurious modes that otherwise lower the Q factor of the device, regardless of the mode number. With such structures, only the main lateral mode is excited due to the new boundary conditions created by the raised frame between the active and outside region of the resonator membrane 18. Additionally, the extra load of the UBM 63 layer over the resonators provides a damping effect that can assist in lowering the shunt resonator frequency response vs. the series resonator frequency response and thus improve the overall performance of the filter.

Figure 42:
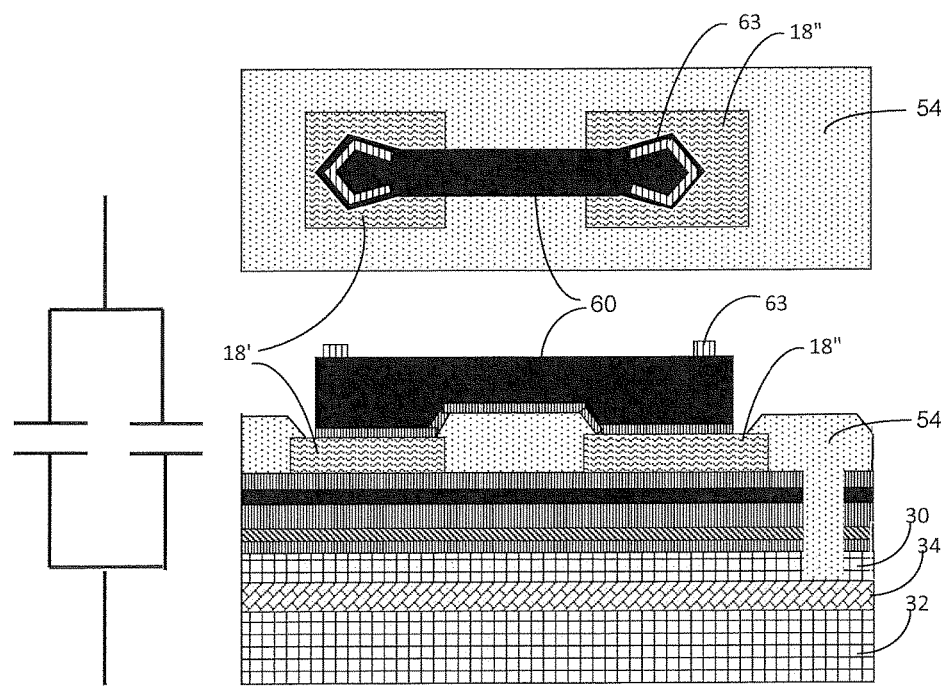
Figure 43:
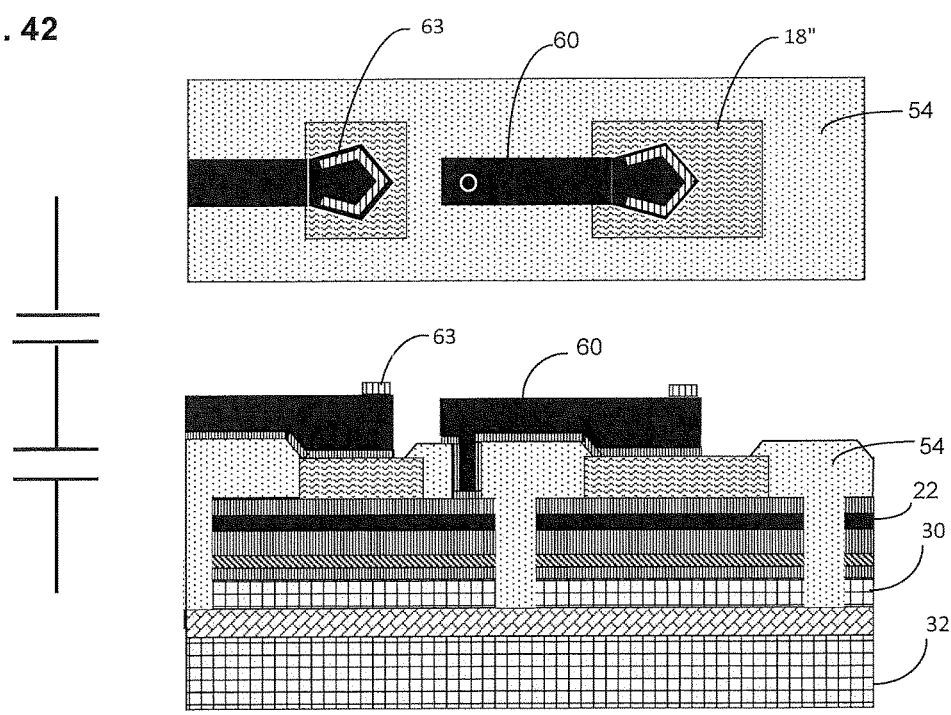

With reference to FIG. 42, by way of schematic illustration only, top and side views of a pair of piezoelectric capacitors coupled in parallel is shown, and with reference to FIG. 43, by way of schematic illustration only, top and side views of a pair of piezoelectric capacitors coupled in series is shown. The superfluous aluminum 60 beyond that required for the electrode may be selectively removed by applying an inductively coupled plasma comprising $Cl_2+BCl_3+Ar$ and the excess parts of the titanium adhesion layer 58 thereby exposed may be selectively removed by reactive induction etching away with $CF_4$ and $O_2$.

It will be noted that the extra weight of the UBM 63 layer provides mechanical damping that can lower the shunt resonator frequency response vs. the series resonator frequency response, and thus improve the overall performance of the filter.

Figure 44:
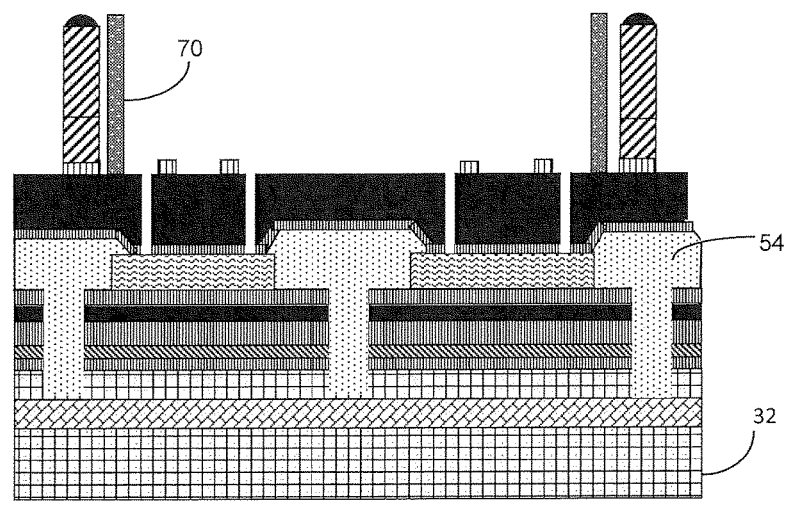

With reference to FIG. 44, a polymer gasket 70 may now be fabricated around an array or resonators defining a filter—Step (n). This may be achieved using SU-8 technology. SU-8 is a commonly used epoxy-based negative photoresist whereby the parts exposed to UV become cross-linked, while the remainder of the film remains soluble and can be washed away during development. SU8 can be deposited as a viscous polymer that can be spun or spread over a thickness ranging from below 1 μm to beyond 300 μm. It is an attractive material since it can be deposited as a tall thin wall that can be about 55 μm high and thus compatible with the solder capped copper pillars, whilst having a width of from 10 to 30 μm.

Figure 45:
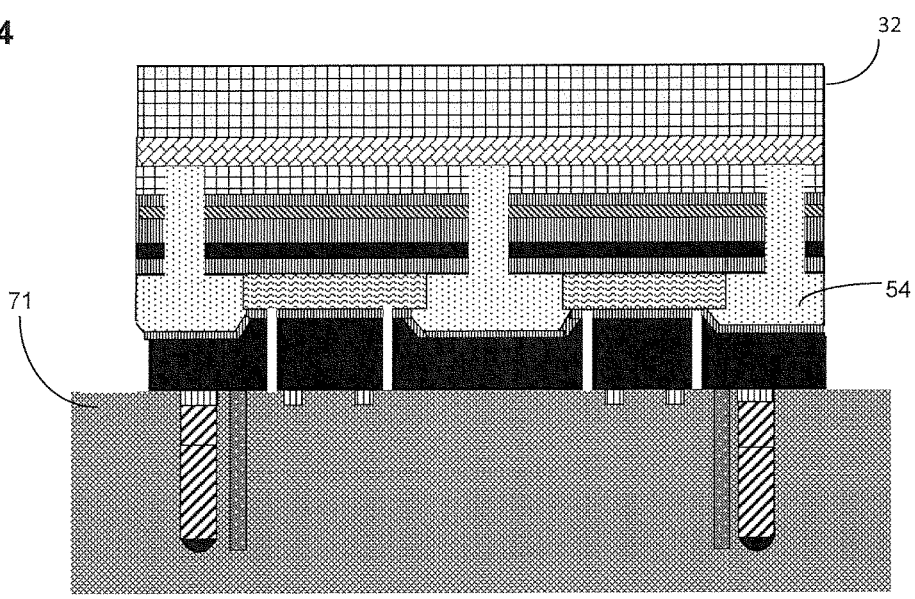
Figure 46:
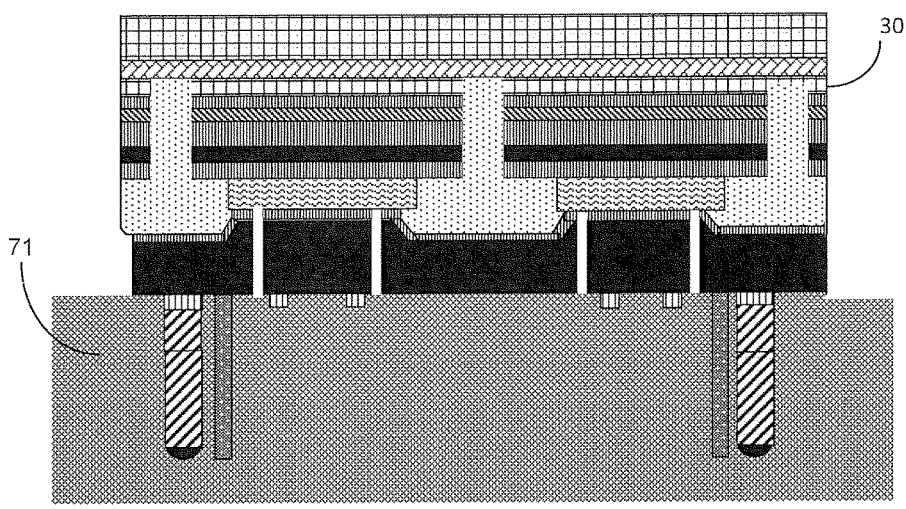
Figure 47:
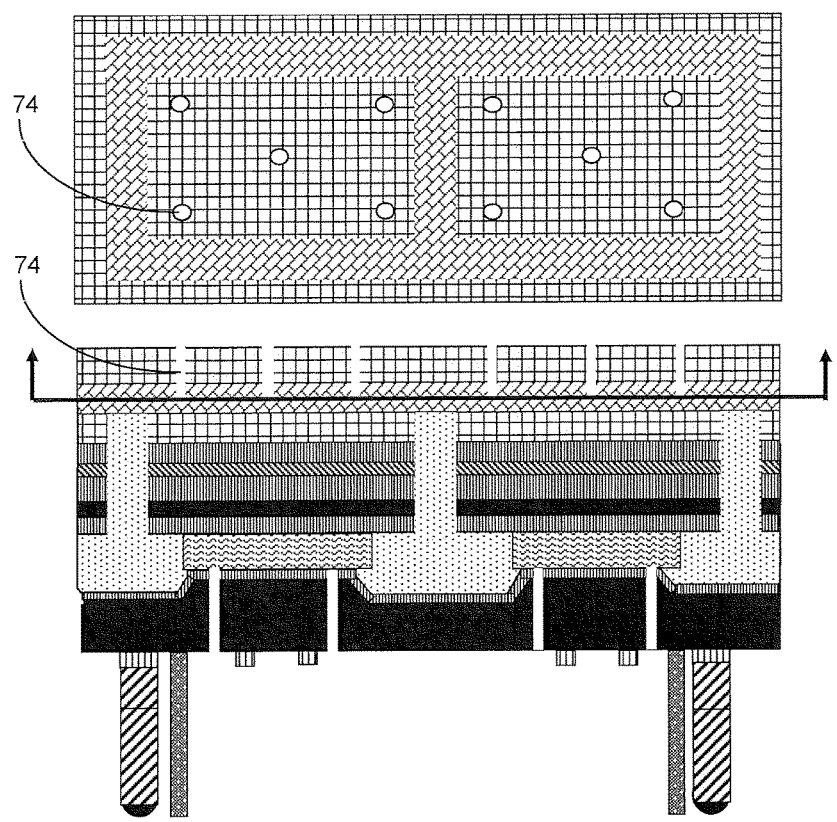

At this stage, as shown in FIG. 45, the array of filters may be attached to a tape 72 with the copper pillars 66 and SU8 gasket 70 side facing downwards, and the silicon handle 32 may be thinned down to about 90 microns—step (o), using chemical mechanical polishing (CMP), to produce the structure shown in FIG. 46. Other possible thinning techniques include mechanical grinding, chemical polishing, wet etching together with atmospheric downstream plasma (ADP) and dry chemical etching (DCE), for example, Unless a SOI substrate 36 having prefabricated cavities 44—FIG. 18—was used, cavities 76 are now formed in the $SiO_2$ 34 layer—step (p). Through silicon via etching (TSV) is used to drill holes 74 through the thinned down silicon handle 32 to the $SiO_2$ box 34—step p(i), FIG. 47 opposite each of the piezoelectric films 18', 18".

Figure 48:
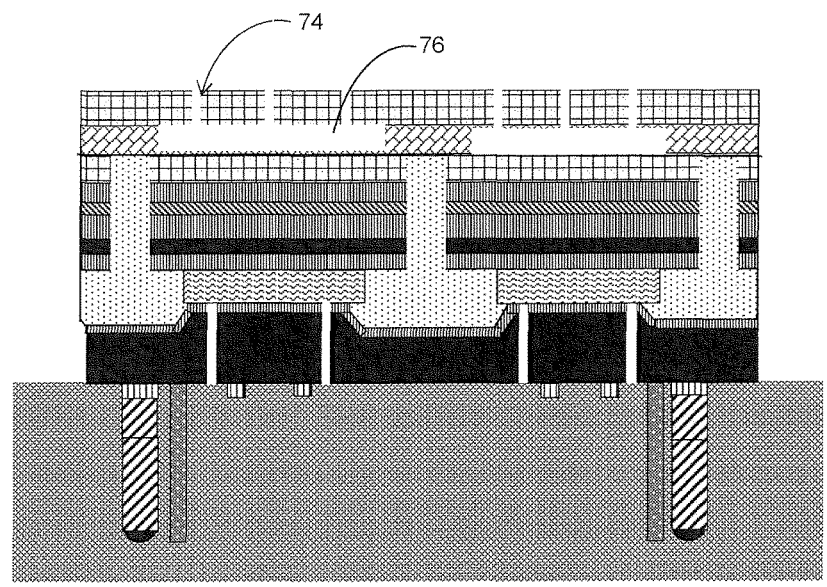

The Silicon Oxide 34 may then be selectively etched away with HF vapor in accordance with the formula $SiO_2 + 4 HF(g) \rightarrow SiF_4(g) + H_2O$ through the silicon via holes 74 to form cavities 76,—step p(ii), FIG. 48. Dry vapor etching is preferable to a wet etch since this enables penetration of small features and prevents the membrane and cover from sticking together.

Up until this stage, the filters are fabricated in arrays using on wafer fabrication techniques. The array is now diced into separate filter units—step (q).

Dicing may take place by mechanical blades, plasma or laser. Plasma or laser may be preferred with some designs in order to avoid membrane damages.

Such dicing tools are available by Disco™ Japan.

Figure 49:
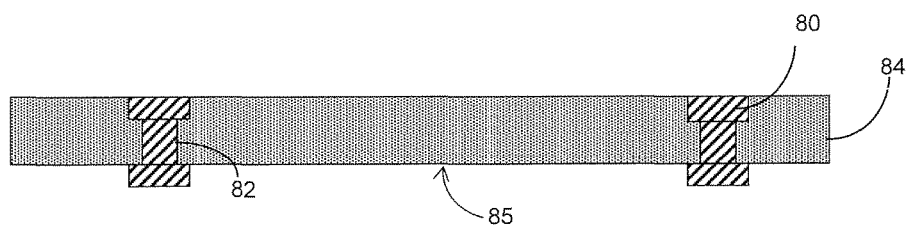

An interposer 85 is now procured step (r). By way of enablement only, a two layer interposer 80 may be fabricated by copper electroplating of pads 80 and vias 82 into photoresist on a sacrificial copper substrate, followed by laminating with a dielectric material 84 having a polymer matrix such as polyimide, epoxy or BT (Bismaleimide/Triazine), Polyphenylene Ether (PPE), Polyphenylene Oxide (PPO) or their blends, either provided as a film, or as a pre-preg reinforced with glass fibers for additional stiffness. More details may be found in U.S. Pat. No. 7,682,972 to Hurwitz et al. titled "Advanced multilayer coreless structures and method for their fabrication" incorporated herein by reference. There are, however, alternative established manufacturing routes for fabricating appropriate interposers. An appropriate interposer 85 with copper pads 80 and vias 82 in a dielectric with polymer matrix 84 is shown in FIG. 49.

In general, the interposer 85 should be thin so that the overall package remains thin. However, it will be appreciated that different resonators 18', 18" may be interconnected via routing layers within the interposer 85, and additional layers may be built up if required.

Figure 50:
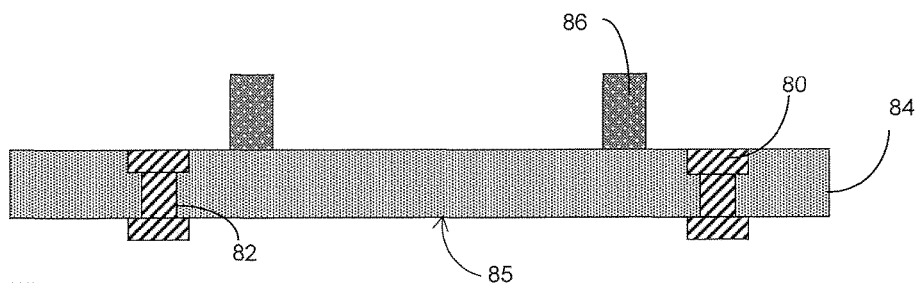

With reference to FIG. 50, usefully an epoxy dam structure 86 may first be deposited on the interposer surface—step (s). The epoxy dam structure 86 may be fabricated by silk-screening an epoxy polymer, or by laminating a dry-film epoxy dam barrier that is photo-imageable. The last method is preferred as it provides high position accuracy with respect to the SU8 gasket 70 on the filter die. It should be noted that dry films may be deposited in several layers to achieve desired thicknesses. As with the gasket 70 around each filter array, the dam 86 could also be fabricated from SU-8. The dam 86 is designed to fit around the gasket 70 and could be slightly larger or smaller in area than the area surrounded by the gasket 70 to be positioned on the inside or outside of the gasket 70. Indeed two dams 86 (one encircling and the encircled by the gasket) or a plurality of gaskets 70 could be provided.

Figure 51:
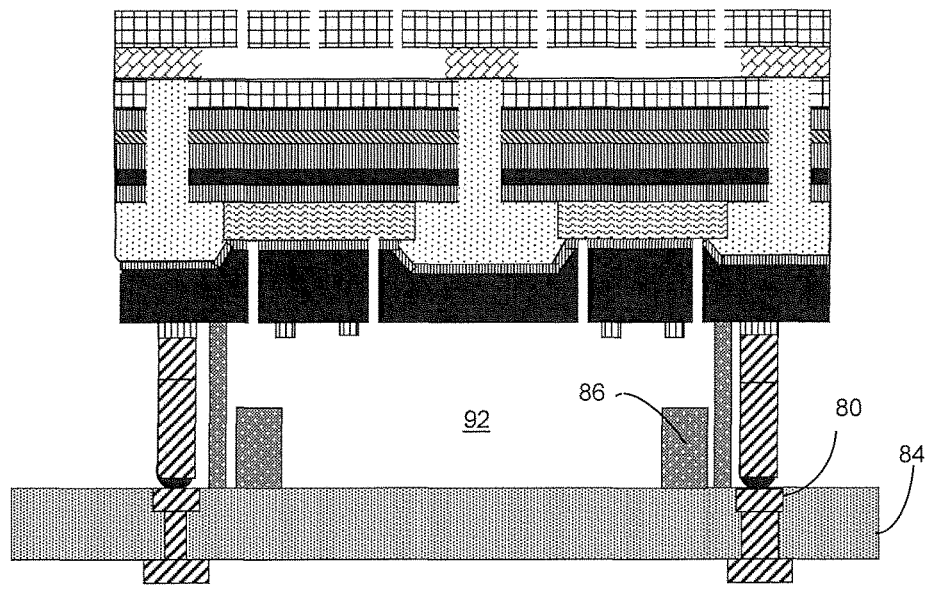

As shown in FIG. 51, the interposer may then be attached to the Composite FBAR resonator array by aligning and melting the solder caps 68 on the copper pillars 66—step (t).

Figure 52:
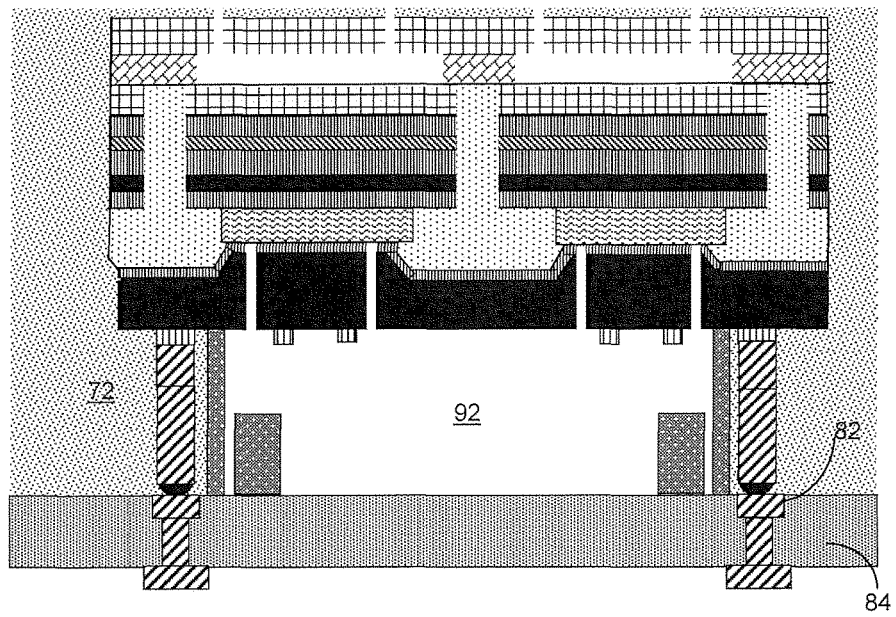
Figure 53:
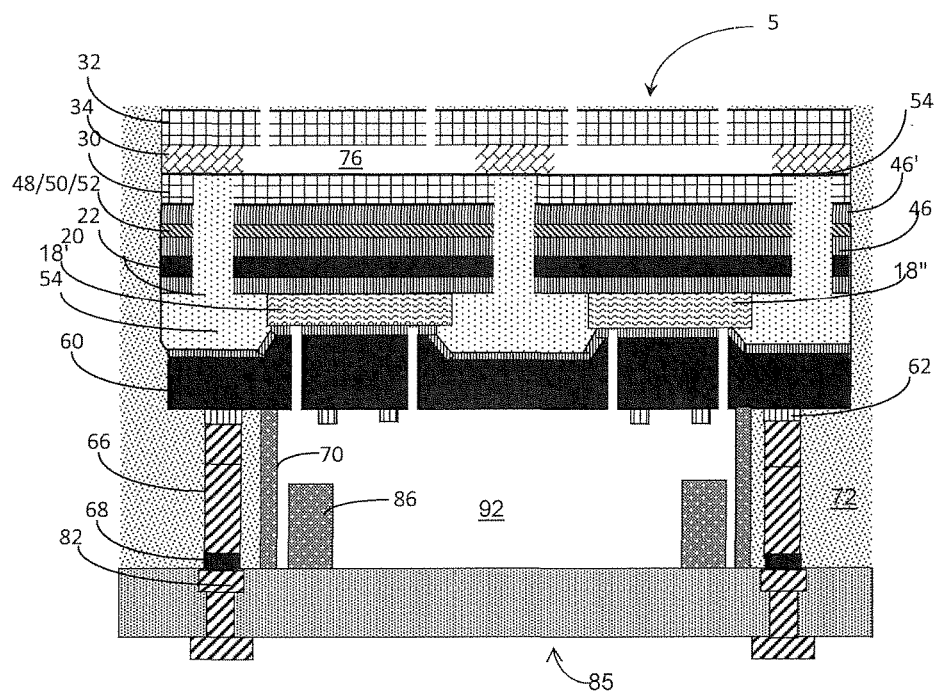

As shown in FIG. 52, the array device may be encapsulated in polymer 90—step (u); the dams 86 and SU8 gaskets 70 working together preventing under fill of the cavity 92 within the gasket 70.

In this manner, the closely aligned SU8 connected to the Composite FBAR array and the epoxy dam connected to the substrate prevents under-fill 72 from filling the cavity 92 under the piezo resonators 18', 18".

The array of resonators is then diced into separate filter modules—stage (v), giving the structure shown in FIG. 1, for testing, packaging and shipment.

The interposer 85 may be a functional substrate with embedded inductors, lines and couplers. It should be noted the interposer 85 may subsequently be placed on the same IC Substrate together with controllers, power amplifiers and switches to generate a fully integrated Front End Module (FEM). This allows all components to be designed together to achieve optimum system performance. Instead of a polymer based interposer, an interface with a Low Temp Co-fired Ceramic (LTCC) may be used.

Thus single crystal Composite FBARs are shown and described.

In resonator/filter designs with a BaxSr(1-x)TiO3 piezoelectric layer, the top electrode may be split into two sections: the Al electrode itself and a separated Al line that runs bias voltage to the piezoelectric membrane and causes it to resonate. This bias voltage is usually between 5V to 40V, the voltage depending on the resonator frequency. For example, Tests performed on 2700 Å Piezo thick BST at 19V have caused the BST to resonate at 6.5 GHz.

Single crystal $Ba_xSr_{(1-x)}TiO_3$ Filters are potentially tunable using capacitors build around the filter on the same silicon carrier. It has been established by numerous research groups that single crystal BST has a tunability ratio of 1:8 or even 1:10 whereas amorphous or polycrystalline BST has only has 1:3 to 1:4 tunability.

Single crystal BST, AlN and AlGaN FBAR resonators and thus filters have the following advantages:

Such filters may save up to half of the RF power wasted as heat in prior art filters because the single crystal orientation enables polarization of the excited acoustic wave.

The filters disclosed herein may operate at higher frequencies since the thickness of the ultra-thin piezoelectric membrane necessary for high frequencies is supported by an additional silicon membrane (composite FBAR).

Having a composite electrode and structure that includes a silicon membrane, such filters may have second or higher harmonic mode frequencies that can extend the operating frequency range of the FBAR Single crystal BST, AlN and AlGaN FBARs disclosed herein use well-known MEMS and LED FAB manufacturing processes rather than dedicated and expensive Si FABs. This may simplify and reduce the investment and total cost to manufacture the filter device.

Single crystal FBARs manufacturing processes disclosed herein use the low cost back-end processes well established and with high yields available by multiple wafer bumping and assembly houses.

Although discussed hereinabove with reference to communication filters, it will be appreciated that thicknessshear-based Composite FBARs and surface generated acoustic wave—based Composite FBARs are also used in other applications. For example they are widely used in biosensors since they provide high sensitivity for the detection of biomolecules in liquids.

Thus persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

The invention claimed is:

1. A filter package comprising an array of piezoelectric films sandwiched between lower electrodes and an array of upper electrodes comprising metal layers and silicon membranes with cavities thereover:
the lower electrode being coupled to an interposer with a first cavity between the lower electrodes and the interposer; the array of silicon membranes having a known thickness and attached over the upper electrodes with an array of upper cavities, each upper cavity between a silicon membrane of the array and a common silicon cover; each upper cavity aligned with a piezoelectric film, an upper electrode and silicon membrane, the upper cavities having side walls comprising $SiO_2$; the individual piezoelectric films, their upper electrodes and silicon membranes thereover being separated from adjacent piezoelectric films, upper electrodes and silicon membranes by a passivation material.

2. The filter package of claim 1, wherein the piezoelectric films comprise a material selected from the group consisting of $Ba_xSr_{(1-x)}TiO_3$ (BST), AlN and $Al_xGa_{(1-x)}N$.

3. The filter package of claim 1, wherein the piezoelectric films have a thickness of up to 2 microns.

4. The filter package of claim 1, wherein the piezoelectric films each comprise a single crystal.

5. The filter package of claim 1 wherein the lower electrodes comprise aluminum.

6. The filter package of claim 5 wherein edges of the lower electrodes are stiffened by an under bump metallization material comprising a titanium adhesion layer followed by at least one of tungsten and tantalum and molybdenum.

7. The filter package of claim 6 wherein an under bump metallization material comprising a titanium adhesion layer and a tungsten, tantalum or molybdenum layer connects the lower electrode to the copper pillars.

8. The filter package of claim 1 wherein the lower electrode is coupled to the interposer by solder tipped copper pillars.

9. The filter package of claim 1 wherein the upper electrodes comprise at least one metal layer selected from the group comprising aluminum, titanium, tungsten, gold and gold-indium layers and a silicon layer.

10. The filter package of claim 1 wherein the upper electrodes are multilayer electrodes comprising at least one metal layer with a relatively low DC resistance and a second metal layer with a relatively high acoustic impedance.

11. The filter package of claim 10 wherein the at least one metal layer with a relatively low DC resistance comprises aluminum and is proximal to the piezoelectric layer, and the second metal layer with a relatively high acoustic impedance comprises tungsten or molybdenum.

12. The filter package of claim 11 wherein the upper electrode further comprises a bonding layer for attachment of the relatively high acoustic impedance layer with the silicon membrane.

13. The filter package of claim 1 wherein the upper electrode comprises either a tungsten or molybdenum layer proximal to the piezoelectric film and a bonding layer between the tungsten or molybdenum layer and the silicon membrane.

14. The filter package of claim 1, wherein the passivation material is selected from the group consisting of polyimide, Benzocyclobutene (BCB), $SiO_2$, $Ta_2O_5$, and $Si_3N_4$.

15. The filter package of claim 1 wherein the upper cavities between the silicon membrane and the silicon handle have side walls comprising residual silicon oxide.

16. The filter package of claim 1 wherein the cavities between the array of silicon membrane and the common silicon cover have a depth of between 3 and 10 microns.

17. The filter package of claim 1 wherein the silicon membranes of the array of upper electrodes are separated by a band of the passivation material that is 3 to 10 microns wide and there is a stepped interface within the silicon layer.

18. The filter package of claim 1 further comprising a first adhesion layer between the piezoelectric membrane and the lower electrode.

19. The filter package of claim 18 wherein the first adhesion layer comprises titanium.

20. The filter package of claim 1 wherein the silicon wafer is attached to the upper electrode by an adhesion layer adjacent to the upper electrode, a bonding layer and a further adhesion layer attached to the silicon wafer thereby creating a composite electrode.

21. The filter package of claim 20 wherein the adhesion layer and further adhesion layer comprise Ti having a thickness in the range of 5 nm to 50 nm with 5% tolerances.

22. The filter package of claim 20 wherein the bonding layer is selected from the group comprising Au—In alloy, Au and AlN.

23. The filter package of claim 1 wherein the silicon membrane is single crystal silicon with orientation of <111> or <100> or <110>.

24. The filter package of claim 1 wherein the silicon membrane has a thickness in the range of 1 micron to 10 microns and is coupled to the silicon cover by silicon oxide.

25. The filter package of claim 24 wherein the silicon cover is below 150 microns thick.

26. The filter package of claim 24 wherein the silicon cover over the cavity is perforated with through silicon via holes.

27. The filter package of claim 1 encapsulated in polymer over-mold/under-fill (MUF), wherein a barrier between the filter array and the interposer provides a perimeter wall of the lower cavity, wherein said barrier comprises at least one of an SU8 gasket around the filter array that is attached to the lower electrode and an epoxy dam attached to the interposer.

28. The filter package of claim 1, wherein the interposer comprises at least one via layer and one routing layer of copper encapsulated a dielectric matrix.

29. The filter package of claim 28, wherein the interposer comprises a polymer matrix selected from the group consisting of polyimide, epoxy, BT (Bismaleimide/Triazine), Polyphenylene Ether (PPE), Polyphenylene Oxide (PPO) and their blends.

30. The filter package of claim 28, wherein the interposer comprises a Low Temperature Cofired Ceramic (LTCC) matrix.

31. The filter package of claim 28, wherein the interposer further comprises glass fibers and/or ceramic fillers.

* * * * *